US009380277B2

(12) United States Patent
Nakata

(10) Patent No.: US 9,380,277 B2
(45) Date of Patent: Jun. 28, 2016

(54) IMAGING DEVICE WITH REDUCED COLOR MIXING AND METHOD OF MANUFACTURING THE SAME

(75) Inventor: Masashi Nakata, Kanagawa (JP)

(73) Assignee: Sony Corporation, Tokyo (JP)

(\*) Notice: Subject to any disclaimer, the term of this patent is extended or adjusted under 35 U.S.C. 154(b) by 0 days.

(21) Appl. No.: 14/233,226

(22) PCT Filed: Jul. 20, 2012

(86) PCT No.: PCT/JP2012/068417
§ 371 (c)(1),
(2), (4) Date: Jan. 16, 2014

(87) PCT Pub. No.: WO2013/018559
PCT Pub. Date: Feb. 7, 2013

(65) Prior Publication Data
US 2014/0146206 A1    May 29, 2014

(30) Foreign Application Priority Data
Jul. 29, 2011 (JP) .................................. 2011-166382

(51) Int. Cl.
| H04N 5/374 | (2011.01) |
| H04N 9/07 | (2006.01) |
| H04N 9/09 | (2006.01) |
| H04N 9/04 | (2006.01) |
| H01L 27/146 | (2006.01) |

(52) U.S. Cl.
CPC ............ *H04N 9/07* (2013.01); *H01L 27/14605* (2013.01); *H01L 27/14621* (2013.01); *H01L 27/14625* (2013.01); *H04N 5/374* (2013.01); *H04N 9/045* (2013.01); *H04N 9/09* (2013.01); *H04N 2209/049* (2013.01); *Y10T 29/49826* (2015.01)

(58) Field of Classification Search
CPC ... H04N 9/09; H04N 2209/049; H04N 9/097; H04N 5/3458; H04N 5/374; H04N 3/1506
USPC ......... 348/263, 266, 271, 272, 277, 278, 294, 348/302, 336
See application file for complete search history.

(56) References Cited

U.S. PATENT DOCUMENTS

| 7,199,348 B2 * | 4/2007 | Olsen et al. ................ 250/208.1 |
| 7,248,297 B2 * | 7/2007 | Catrysse et al. ............. 348/273 |
| 2009/0266978 A1 * | 10/2009 | Lenchenkov ................ 250/226 |

FOREIGN PATENT DOCUMENTS

| JP | 02-285674 | 11/1990 |
| JP | 11-340447 | 12/1999 |
| JP | 2002-184965 | 6/2002 |
| JP | 2006-033493 | 2/2006 |
| JP | 2007-294552 | 11/2007 |
| JP | 2008-134610 | 6/2008 |

(Continued)

*Primary Examiner* — Hung Lam
(74) *Attorney, Agent, or Firm* — Chip Law Group

(57) ABSTRACT

The present technique relates to an imaging device that can reduce color mixing that occurs between an on-chip lens and a photodiode, and a method of manufacturing the imaging device.
The imaging device includes a first unit pixel including a photodiode unit that receives light, a first color filter that faces at least part of the photodiode unit, and a second color filter that faces the first color filter, the first color filter and the second color filter being located at a distance from each other. The present technique can be applied to imaging devices or imaging apparatuses.

10 Claims, 17 Drawing Sheets

(56) References Cited

FOREIGN PATENT DOCUMENTS

| JP | 2010-165718 | 7/2010 |
| JP | 2010-232595 | 10/2010 |
| JP | 2010-258104 | 11/2010 |
| JP | 2010-278272 | 12/2010 |
| JP | 2011-040454 | 2/2011 |
| JP | 2011-049203 | 3/2011 |

* cited by examiner (Conventional Pixel Structure)

IMAGING DEVICE WITH REDUCED COLOR MIXING AND METHOD OF MANUFACTURING THE SAME

TECHNICAL FIELD

The present technique relates to an imaging device and a method of manufacturing the imaging device, and more particularly, to an imaging device capable of reducing color mixing that occurs between an on-chip lens and a photodiode, and a method of manufacturing the imaging device.

BACKGROUND ART

Conventionally, pixels each having only one color filter layer of one type provided therein are used in an imaging device such as a CMOS (Complementary Metal Oxide Semiconductor) image sensor (see Patent Document 1, for example). Also, there are cases where pixels each having two kinds of color filters stacked therein are used in a conventional imaging device (see Patent Document 2, for example), or where pixels each having color filters with heights varying with color are used in a conventional imaging device (see Patent Document 3, for example).

CITATION LIST

Patent Documents

Patent Document 1: JP 2010-232595 A
Patent Document 2: JP 2002-184965 A
Patent Document 3: JP 02-285674 A

SUMMARY OF THE INVENTION

Problems to be Solved by the Invention

In a pixel having a conventional structure such as one of those disclosed in Patent Documents 1 through 3, however, light that has been collected by an on-chip lens and has passed through a color filter leaks into the photodiode of an adjacent pixel before entering the photodiode of the pixel. As a result, color mixing occurs. Color mixing might result in a reduction in S/N (Signal to Noise Ratio) or color reproducibility. Therefore, there is a demand for a method of reducing color mixing that occurs between an on-chip lens and a photodiode.

The present technique has been developed in view of those circumstances, and aims to reduce color mixing that occurs between an on-chip lens and a photodiode.

Solutions to Problems

An imaging device of a first aspect of the present technique includes a first unit pixel including: a photodiode unit that receives light; a first color filter that faces at least part of the photodiode unit; and a second color filter that faces the first color filter, the first color filter and the second color filter being located at a distance from each other.

The first color filter and the second color filter have the same spectral transmittance characteristics.

The imaging device further includes a second unit pixel including a photodiode unit that receives light.

The second unit pixel further includes a third color filter facing at least part of the photodiode unit.

The first color filter and the second color filter have different spectral transmittance characteristics from each other, and the degree of similarity in spectral transmittance characteristics between the first color filter and the second color filter is higher than the degree of similarity in spectral transmittance characteristics between the first color filter and the third color filter included in the second unit pixel, and is higher than the degree of similarity in spectral transmittance characteristics between the second color filter and the third color filter included in the second unit pixel.

The second unit pixel further includes a fourth color filter located at a distance from the third color filter.

The first unit pixel and the second unit pixel each further include an on-chip lens that collects light.

The first unit pixel includes N color filters including the first color filter and the second color filter, and the second unit pixel includes M color filters including the third color filter. Here, N is an integer of 2 or greater, and M is an integer of 1 or greater, M being different from N.

The first color filter is placed directly on the photodiode.

A planarizing film is applied onto the photodiode, and the first color filter is placed on the planarizing film.

A waveguide is formed on the photodiode, and the first color filter is placed on the waveguide.

A method of manufacturing an imaging device formed with unit pixels of a second aspect of the present technique includes manufacturing each of the unit pixels by: forming a first color filter directly on a photodiode, on a planarizing film applied onto the photodiode, or on a waveguide formed on the photodiode; applying a planarizing film onto the first color filter; forming a second color filter on the planarizing film; and forming an on-chip lens on the second color filter.

The imaging device of the first aspect of the present technique includes a first unit pixel including: a photodiode unit that receives light; a first color filter that faces at least part of the photodiode unit; and a second color filter that faces the first color filter, the first color filter and the second color filter being located at a distance from each other.

The method of manufacturing an imaging device formed with unit pixels of the second aspect of the present technique includes manufacturing each of the unit pixels by: forming a first color filter directly on a photodiode, on a planarizing film applied onto the photodiode, or on a waveguide formed on the photodiode; applying a planarizing film onto the first color filter; forming a second color filter on the planarizing film; and forming an on-chip lens on the second color filter.

Effects of the Invention

As described above, according to the present technique, color mixing that occurs between an on-chip lens and a photodiode can be reduced.

MODES FOR CARRYING OUT THE INVENTION

The following is a description of embodiments of the present technique.

First, the inventors have made studies on color mixing that occurs between an on-chip lens and a photodiode, using conventional pixels of an image sensor. In the following description, the light receiving surface of an image sensor will be referred to as the upper surface, and the surface on the opposite side from the light receiving surface as the lower surface. A direction parallel to the normal line of the light receiving surface will be referred to as the vertical direction, and a direction parallel to the light receiving surface as the horizontal direction.

[Pixels Having Conventional Structures]

Figure 1:
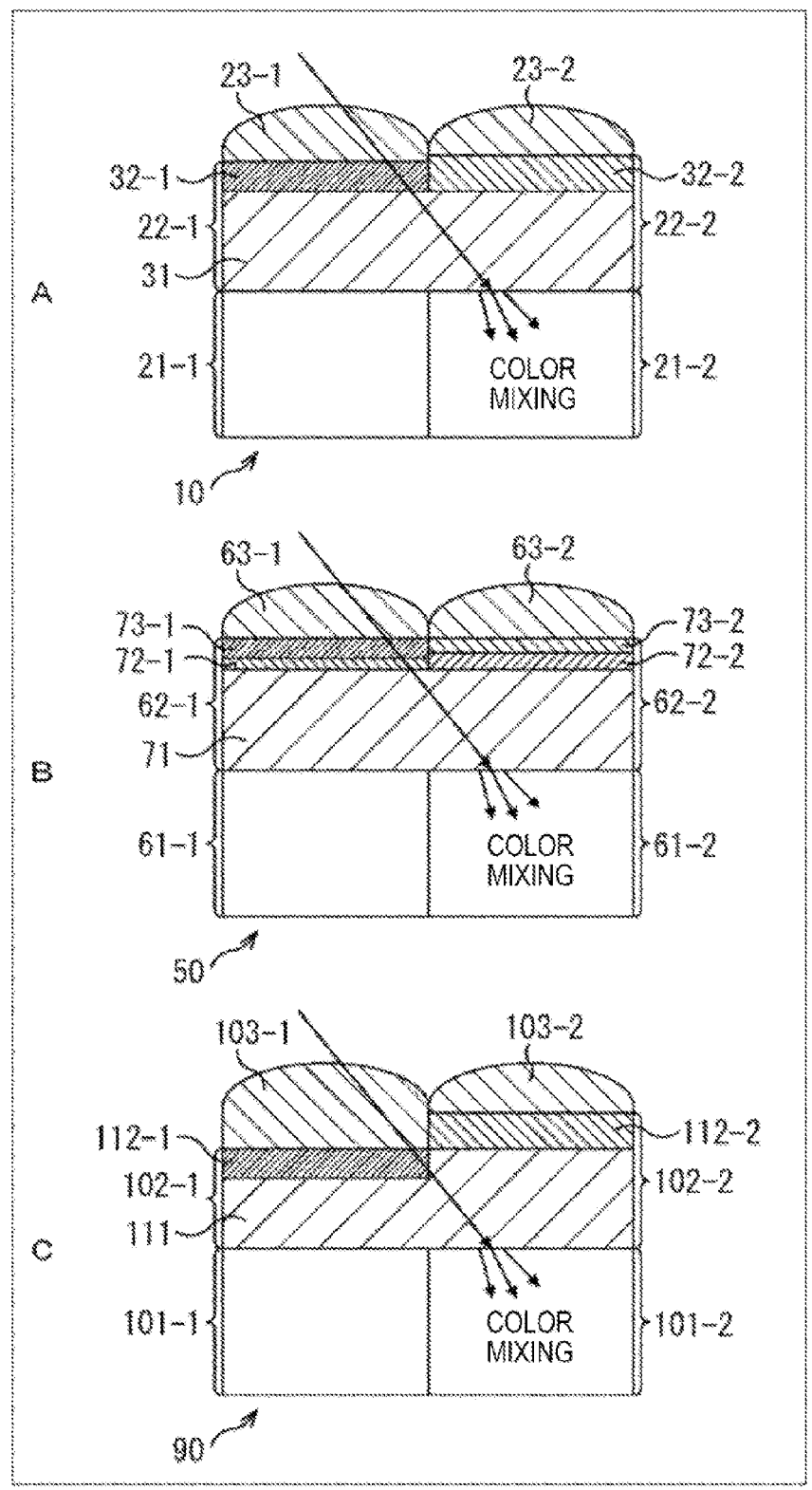
FIG. 1 shows cross-sectional views of pixel units having conventional structures.

FIG. 1 shows cross-sectional views of pixel units that have conventional structures and are used in a back-illuminated image sensor. A pixel unit is formed with unit pixels of three colors, which are a red unit pixel, a green unit pixel, and a blue unit pixel, for example. However, this drawing only shows unit pixels of two colors, or, more particularly, combinations of a green unit pixel and a red unit pixel, for ease of explanation. A unit pixel is formed with components such as a photodiode, a color filter, and an on-chip lens.

A in FIG. 1 is a cross-sectional view of a pixel unit 10 formed with a set of two unit pixels each having only one layer of a color filter provided therein. In the pixel unit 10, a green photodiode 21-1 and a red photodiode 21-2 are arranged adjacent to each other. A green filter portion 22-1 and an on-chip lens 23-1 are stacked, in this order from the bottom, on the green photodiode 21-1. A red filter portion 22-2 and an on-chip lens 23-2 are stacked, in this order from the bottom, on the red photodiode 21-2.

The green filter portion 22-1 is formed by stacking the left-side portion of a planarizing film 31 and a green color filter 32-1 in this order from the bottom. The red filter portion 22-2 is formed by stacking the right-side portion of the planarizing film 31 and a red color filter 32-2 in this order from the bottom. In other words, the pair of the green filter portion 22-1 and the red filter portion 22-2 is formed by stacking the planarizing film 31 and the pair of the green color filter 32-1 and the red color filter 32-2 in this order from the bottom. The planarizing film 31 is a film that passes light.

Light that enters the on-chip lens 23-1 passes through the green color filter 32-1 and the planarizing film 31, and is collected on and enters the green photodiode 21-1. More accurately, of the light exiting from the on-chip lens 23-1, only the light in a specific wavelength band (or a green wavelength band) passes through the green color filter 32-1, further passes through the planarizing film 31, and then enters the green photodiode 21-1. The green photodiode 21-1 outputs an electrical signal at a level corresponding to the amount of the incident light or the amount of the received light.

Light that enters the on-chip lens 23-2 is collected on and enters the red photodiode 21-2 through the same path as above. In this case, however, of the light exiting from the on-chip lens 23-2, only the light in a specific wavelength band (a red wavelength band) passes through the red color filter 32-2.

As shown in A in FIG. 1, of the light exiting from the on-chip lens 23-1, part of the light that has passed through the green color filter 32-1 leaks into the adjacent red photodiode 21-2, and the leakage light turns into a color mixing component to cause color mixing. Likewise, of the light exiting from the on-chip lens 23-2, part of the light that has passed through the red color filter 32-2 leaks into the adjacent green photodiode 21-1, and the leakage light turns into a color mixing component to cause color mixing.

B in FIG. 1 is a cross-sectional view of a pixel unit 50 formed with a set of two unit pixels each having two kinds of color filters stacked therein. In the pixel unit 50, a green photodiode 61-1 and a red photodiode 61-2 are arranged adjacent to each other. A green filter portion 62-1 and an on-chip lens 63-1 are stacked, in this order from the bottom, on the green photodiode 61-1. A red filter portion 62-2 and an on-chip lens 63-2 are stacked, in this order from the bottom, on the red photodiode 61-2.

The green filter portion 62-1 is formed by stacking the left-side portion of a planarizing film 71 and a green color filter formed with a lower color filter 72-1 and an upper color filter 73-1, in this order from the bottom. The red filter portion 62-2 is formed by stacking the right-side portion of the planarizing film 71 and a red color filter formed with a lower color filter 72-2 and an upper color filter 73-2, in this order from the bottom. In other words, the pair of the green filter portion 62-1 and the red filter portion 62-2 is formed by stacking the planarizing film 71 and the pair of the green color filter formed with the lower color filter 72-1 and the upper color filter 73-1, and the red color filter formed with the lower color filter 72-2 and the upper color filter 73-2, in this order from the bottom. The lower color filter 72-1 and the upper color filter 73-1 of the green color filter adhere to each other. Likewise, the lower color filter 72-2 and the upper color filter 73-2 of the red color filter adhere to each other.

Light that enters the on-chip lens 63-1 passes through the green color filter formed with the upper color filter 73-1 and the lower color filter 72-1, and the planarizing film 71, and is collected on and enters the green photodiode 61-1. More accurately, of the light exiting from the on-chip lens 63-1, only the light in the green wavelength band passes through the green color filter formed with the upper color filter 73-1 and the lower color filter 72-1, and further passes through the planarizing film 71, and then enters the green photodiode 61-1. The green photodiode 61-1 outputs an electrical signal at a level corresponding to the amount of the incident light or the amount of the received light.

Light that enters the on-chip lens 63-2 is collected on and enters the red photodiode 61-2 through the same path as above. In this case, however, of the light exiting from the on-chip lens 63-2, only the light in the red wavelength band passes through the red color filter formed with the upper color filter 73-2 and the lower color filter 72-2.

As shown in B in FIG. 1, of the light exiting from the on-chip lens 63-1, part of the light that has passed through the green color filter formed with the upper color filter 73-1 and the lower color filter 72-1 leaks into the adjacent red photodiode 61-2, and the leakage light turns into a color mixing component to cause color mixing. Likewise, of the light exiting from the on-chip lens 63-2, part of the light that has passed through the red color filter formed with the upper color filter 73-2 and the lower color filter 72-2 leaks into the adjacent green photodiode 61-1, and the leakage light turns into a color mixing component to cause color mixing.

C in FIG. 1 is a cross-sectional view of a pixel unit 90 formed with a set of two unit pixels having color filters with different heights between colors. In the pixel unit 90, a green photodiode 101-1 and a red photodiode 101-2 are arranged adjacent to each other. A green filter portion 102-1 and an on-chip lens 103-1 are stacked, in this order from the bottom, on the green photodiode 101-1. A red filter portion 102-2 and an on-chip lens 103-2 are stacked, in this order from the bottom, on the red photodiode 101-2.

The green filter portion 102-1 is formed by stacking the left-side portion of a planarizing film 111 and a green color filter 112-1 in this order from the bottom. The red filter portion 102-2 is formed by stacking the right-side portion of the planarizing film 111 and a red color filter 112-2 in this order from the bottom. In other words, the pair of the green filter portion 102-1 and the red filter portion 102-2 is formed by stacking the planarizing film 111 and the pair of the green color filter 112-1 and the red color filter 112-2 in this order from the bottom. The green color filter 112-1 and the red color filter 112-2 are arranged so that the distance between the green photodiode 101-1 and the green color filter 112-1 differs from the distance between the red photodiode 101-2 and the red color filter 112-2.

Light that enters the on-chip lens 103-1 passes through the green color filter 112-1 and the planarizing film 111, and is collected on and enters the green photodiode 101-1. More accurately, of the light exiting from the on-chip lens 103-1, only the light in the green wavelength band passes through the green color filter 112-1, further passes through the planarizing film 111, and then enters the green photodiode 101-1. The green photodiode 101-1 outputs an electrical signal at a level corresponding to the amount of the incident light or the amount of the received light.

Light that enters the on-chip lens 103-2 is collected on and enters the red photodiode 101-2 through the same path as above. In this case, however, of the light exiting from the on-chip lens 103-2, only the light in the red wavelength band passes through the red color filter 112-2.

As shown in C in FIG. 1, of the light exiting from the on-chip lens 103-1, part of the light that has passed through the green color filter 112-1 leaks into the adjacent red photodiode 101-2, and the leakage light turns into a color mixing component to cause color mixing. Likewise, of the light exiting from the on-chip lens 103-2, part of the light that has passed through the red color filter 112-2 leaks into the adjacent green photodiode 101-1, and the leakage light turns into a color mixing component to cause color mixing.

As described above, in the pixel unit 10 and the like having conventional structures, color mixing occurs between an on-chip lens and a photodiode, like color mixing between the on-chip lens 23-1 and the green photodiode 21-1. The color mixing that occurs in this manner might result in a decrease in S/N or color reproducibility.

[Pixels Having Thicknesses of Upper Layers Reduced]

As a technique to reduce color mixing, there is a method of reducing the thickness of the upper layer of each unit pixel. It should be noted that the upper layer is the portions stacked on a photodiode, or is formed with the filter portion and the on-chip lens, and particularly, the upper layer is made thinner by reducing the thickness of the planarizing film.

Figure 2:
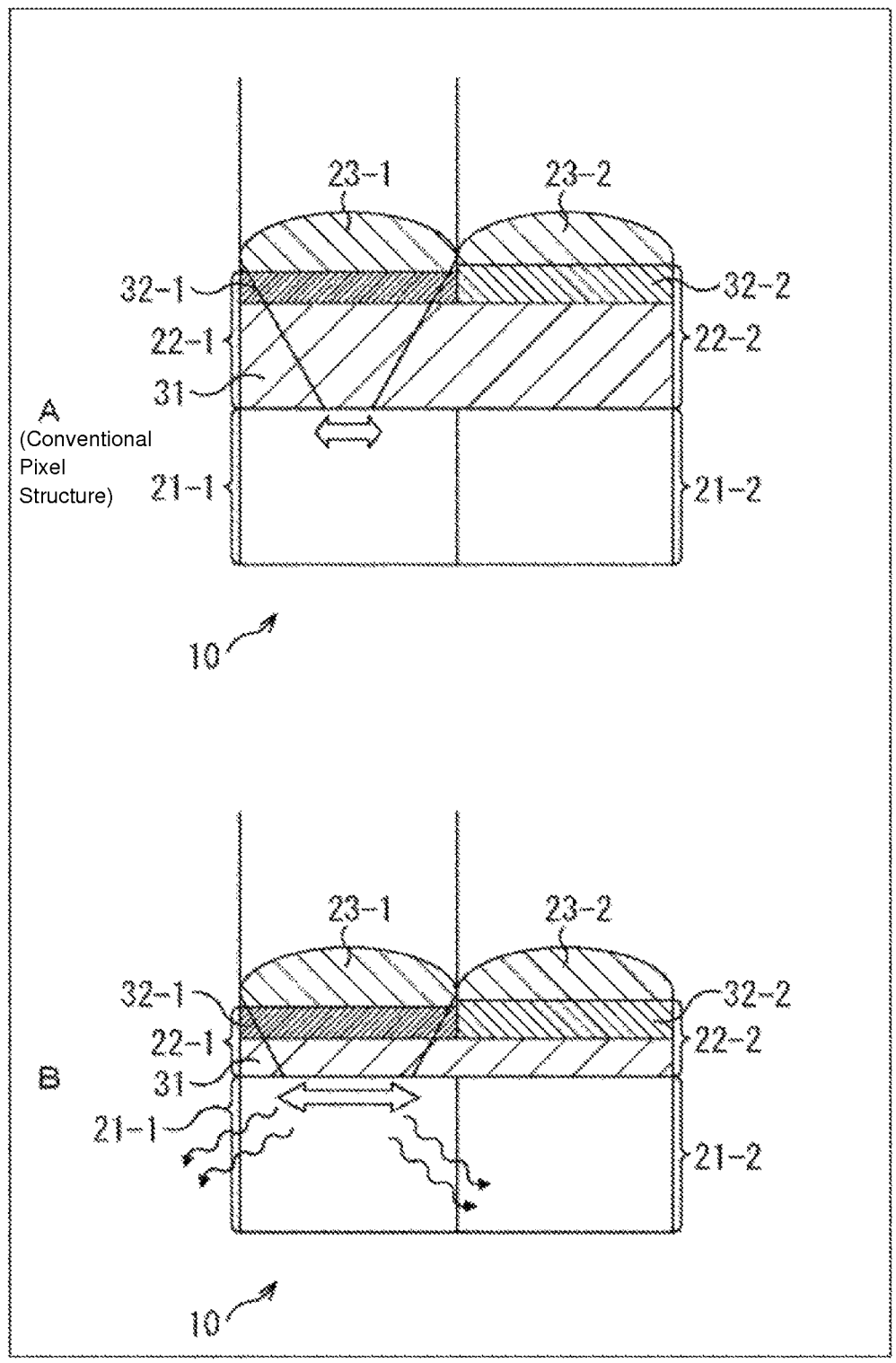
FIG. 2 shows diagrams for explaining a reduction in the thickness of the upper layer of each unit pixel.

FIG. 2 shows diagrams for explaining a reduction in the thickness of the upper layer of each unit pixel.

The pixel unit 10 shown in A in FIG. 2 is a pixel unit prior to a reduction in the thickness of the upper layer of each unit pixel. The double-headed arrow shown in the green photodiode 21-1 indicates the region to be illuminated with the light collected by the on-chip lens 23-1 (hereinafter referred to as the light collecting point). In the pixel unit 10, color mixing occurs, as described above with reference to A in FIG. 1.

Therefore, as shown in B in FIG. 2, the distance between the on-chip lens 23-1 and the green photodiode 21-1, and the distance between the on-chip lens 23-2 and the red photodiode 21-2 are shortened by reducing the thickness of the planarizing film 31 included in the green filter portion 22-1 and the red filter portion 22-2. In this manner, the thickness of the upper layers is reduced. As the upper layer of each unit pixel is made thinner, the amount of light leaking into the adjacent pixel in the upper layer portion is reduced by the amount equivalent to the reduction in the length of the light path in the upper layer portion. Accordingly, color mixing is reduced.

However, the light collecting point of the green photodiode 21-1 becomes wider as the upper layer of the unit pixel is made thinner, as shown in B in FIG. 2. When the light collecting point becomes wider, sensitivity might become lower, or color mixing might occur in the photodiode. In this case, the light collecting point can be controlled by adjusting the curvature of the on-chip lens 23-1. For example, in a case where the thickness of the upper layer of each unit pixel is reduced, widening of the light collecting point can be prevented by increasing the curvature of the on-chip lens. However, the difficulty in processing in the manufacturing process becomes higher as the pixel size becomes smaller. Therefore, there are cases where it is difficult to adjust the curvature of each on-chip lens.

In view of this, the inventors have developed a method of arranging layers of color filters of the same color at a distance from one another in the vertical direction for each unit pixel. With such a method being referred to as the method of the present technique, color mixing that occurs between an on-chip lens and a photodiode can be reduced by using the method of the present technique.

[Unit Pixels to which the Present Technique is Applied]

Figure 3:
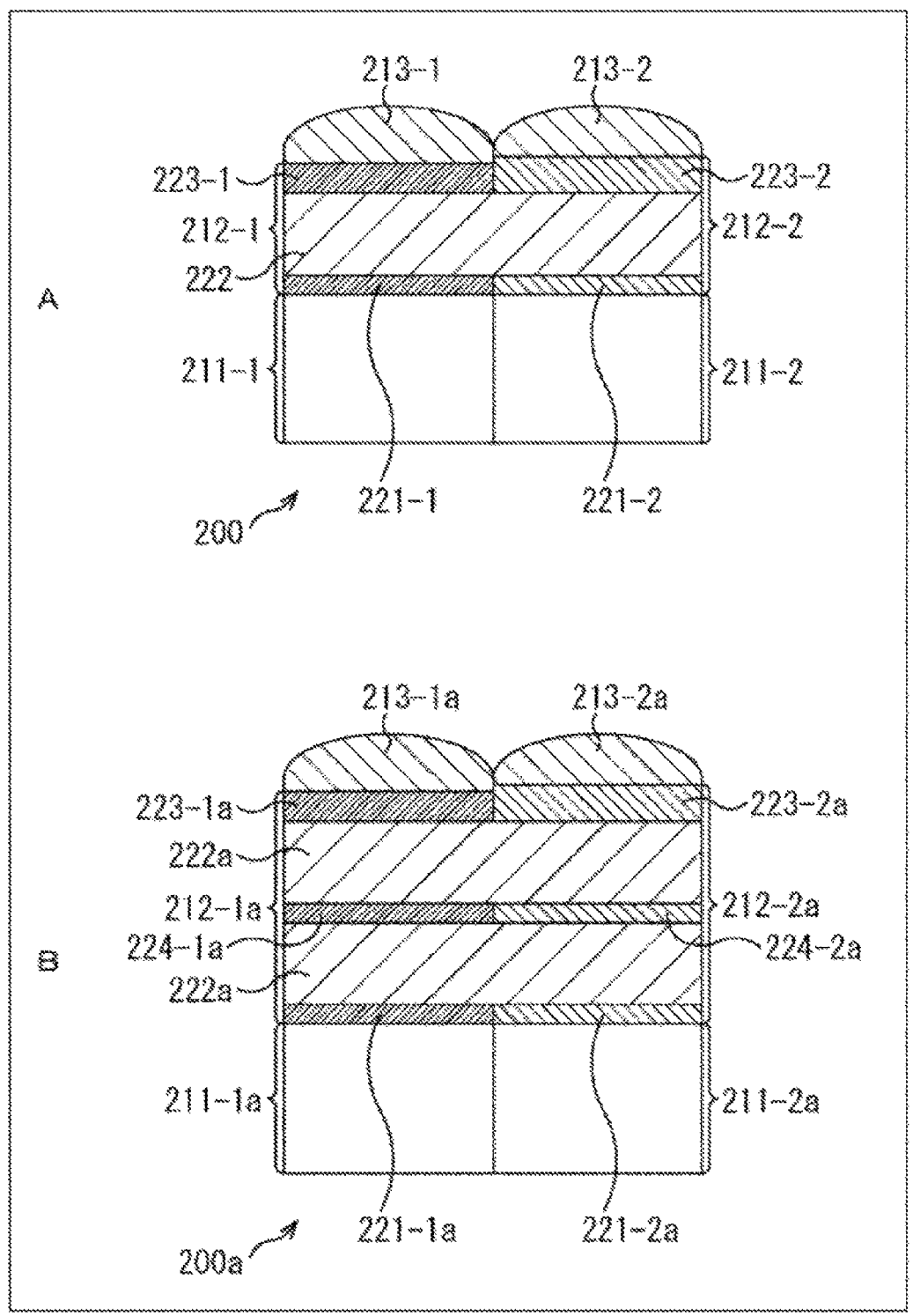
FIG. 3 shows cross-sectional views of pixel units formed with unit pixels to which the present technique is applied.

A in FIG. 3 is a cross-sectional view of a pixel unit 200 that is used in a back-illuminated image sensor and is formed with unit pixels to which the present technique is applied. This drawing only shows unit pixels of two colors, or, more particularly, a pair of a green unit pixel and a red unit pixel, for ease of explanation, but the present technique is of course not limited to that. In each of the unit pixels constituting the pixel unit 200, layers of color filters are arranged at a distance from each other in the vertical direction. Although an example case where two layers of color filters are provided for one unit pixel will be described below, the number of color filters to be provided is not limited to two.

In the pixel unit 200, a green photodiode 211-1 and a red photodiode 211-2 are arranged adjacent to each other. A green filter portion 212-1 and an on-chip lens 213-1 are stacked, in this order from the bottom, on the green photodiode 211-1. A red filter portion 212-2 and an on-chip lens 213-2 are stacked, in this order from the bottom, on the red photodiode 211-2.

The green filter portion 212-1 is formed by stacking a lower green color filter 221-1, the left-side portion of a planarizing film 222, and an upper green color filter 223-1, in this order from the bottom. The red filter portion 212-2 is formed by stacking a lower red color filter 221-2, the right-side portion of the planarizing film 222, and an upper red color filter 223-2, in this order from the bottom. In other words, the pair of the green filter portion 212-1 and the red filter portion 212-2 is formed by stacking the pair of the lower green color filter 221-1 and the lower red color filter 221-2, the planarizing film 222, and the pair of the upper green color filter 223-1 and the upper red color filter 223-2, in this order from the bottom. The pair of the lower green color filter 221-1 and the lower red color filter 221-2 is placed directly on the green photodiode 211-1 and the red photodiode 211-2, or placed as close as possible to the green photodiode 211-1 and the red photodiode 211-2. The lower green color filter 221-1 and the upper green color filter 223-1 are arranged at a distance from each other, with the planarizing film 222 being interposed in between. The same applies to the lower red color filter 221-2 and the upper red color filter 223-2.

The example case where two layers of color filters are provided for one unit pixel is shown in A in FIG. 3. In a case where more than two layers of color filters are provided, at least one pair of color filters among the pairs of color filters facing each other is arranged so that the two color filters in at least one pair are located at a distance from each other. Here, two layers facing each other means two layers located at the shortest distance from each other, or two layers closest to each other.

B in FIG. 3 is a cross-sectional view of a pixel unit 200*e* formed with unit pixels each having three layers of color filters provided therein. In the green unit pixel of the pixel unit 200*e*, pairs of color filters facing each other are the pair of a lower green color filter 221-1*a* and an intermediate green color filter 224-1*a* (hereinafter referred to as the first pair), and the pair of the intermediate green color filter 224-1*a* and an upper green color filter 223-1*a* (hereinafter referred to as the second pair), for example. Here, the pair of the lower green color filter 221-1*a* and the upper green color filter 223-1*a* is not formed with two layers closest to each other, and therefore, is not a pair of color filters facing each other.

In the green unit pixel shown in B in FIG. 3, the pairs of color filters facing each other, or the first pair and the second pair, each have two color filters arranged at a distance from each other. However, at least one of the first and second pairs should have color filters arranged at a distance from each other.

Figure 4:
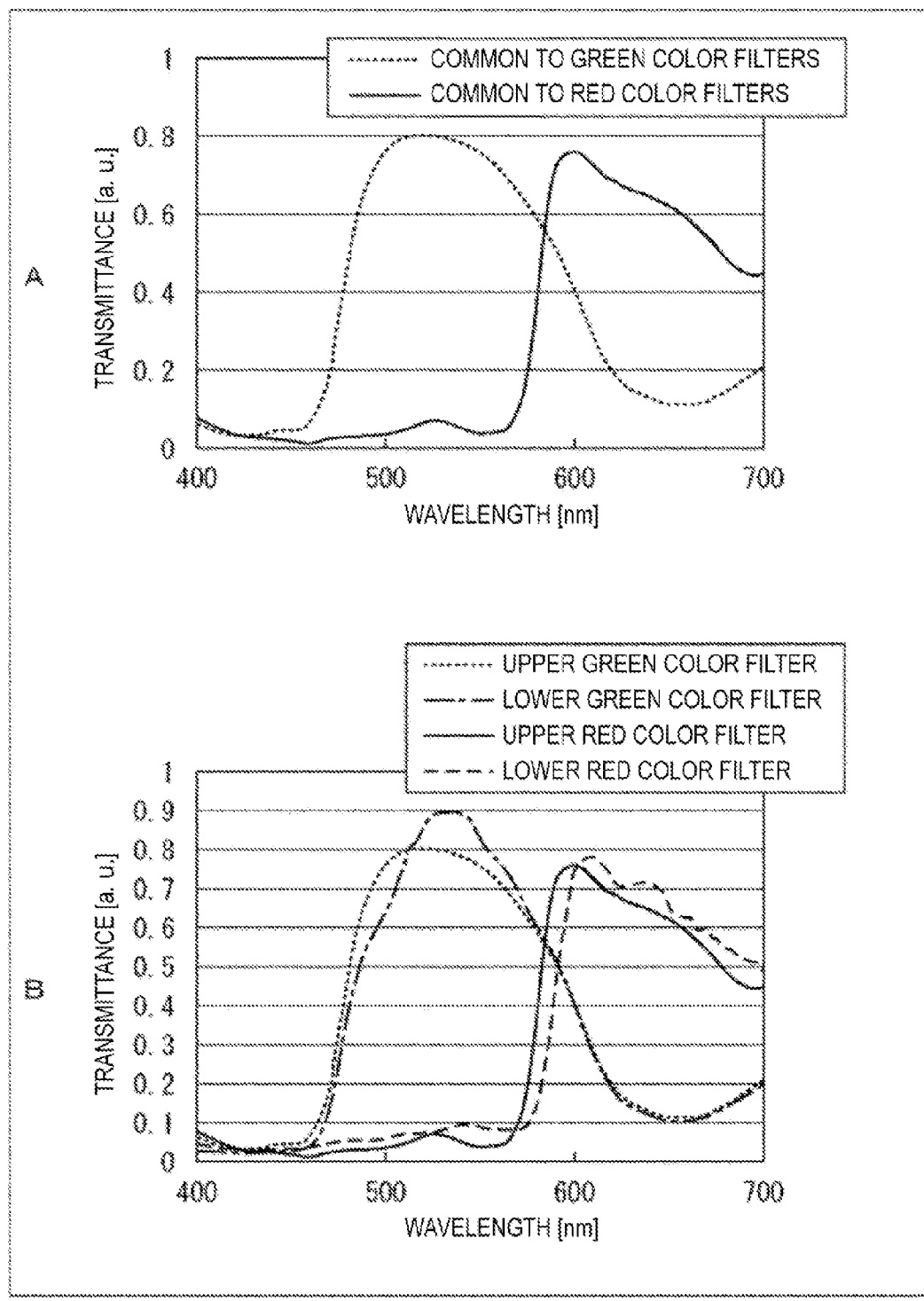
FIG. 4 shows graphs of the spectral transmittance curves of color filters.

Here, the lower green color filter 221-1 and the upper green color filter 223-1 are color filters of the same color. Also, the lower red color filter 221-2 and the upper red color filter 223-2 are color filters of the same color. Here, the same color means that the spectral transmittance characteristics of the materials of color filters are the same, or the color remains the same with varied spectral transmittance characteristics. Referring next to FIG. 4, the colors of the color filters provided in the unit pixels constituting the pixel unit 200 are described.

[Colors of the Color Filters Provided in Unit Pixels]

FIG. 4 shows graphs of the spectral transmittance curves of the color filters provided in the unit pixels constituting the pixel unit 200. In FIG. 4, the ordinate axis indicates transmittance, and the abscissa axis indicates wavelength.

As shown in A in FIG. 4, the characteristics of the lower green color filter 221-1 and the upper green color filter 223-1 indicated by the dotted line exhibit the same spectral transmittance, and the transmittance of both filters becomes highest when wavelength is approximately 520 nm. The characteristics of the lower red color filter 221-2 and the upper red color filter 223-2 indicated by the solid line exhibit the same spectral transmittance, and the transmittance of both filters becomes highest when wavelength is approximately 600 nm. That is, the lower green color filter 221-1 and the upper green color filter 223-1 are made of such a material that the spectral transmittance characteristics of both filters become the same, and the lower red color filter 221-2 and the upper red color filter 223-2 are made of such a material that the spectral transmittance characteristics of both filters become the same. As described above, the layers of color filters provided in the vertical direction in each of the unit pixels constituting the pixel unit 200 have the same spectral transmittance characteristics, as shown in A in FIG. 4.

As shown in B in FIG. 4, the characteristics of the lower green color filter 221-1 indicated by the dot-and-dash line and the characteristics of the upper green color filter 223-1 indicated by the dotted line exhibit different spectral transmittances from each other, but the transmittance of each of the two filters become highest when the wavelength is approximately 520 nm. Also, the characteristics of the lower red color filter 221-2 indicated by the dashed line and the characteristics of the upper red color filter 223-2 indicated by the solid line exhibit different spectral transmittances from each other, and the transmittance of each of the two filters becomes highest when the wavelength is approximately 600 nm. That is, the characteristics of the lower green color filter 221-1 and the upper green color filter 223-1 are of the same color though differing in spectral transmittance characteristics, and the characteristics of the lower red color filter 221-2 and the upper red color filter 223-2 are of the same color though differing in spectral transmittance characteristics.

It should be noted that the same color means that the spectral transmittance characteristics of the lower color filter placed on the photodiode of the unit pixel of a first color are more similar to the spectral transmittance characteristics of the upper color filter placed above the photodiode of the unit pixel of the first color than to the spectral transmittance characteristics of the color filters placed on the photodiode of the adjacent unit pixel of a second color. A spectrum is calculated by multiplying the spectral transmittances of layers of color filters provided in the vertical direction, and accordingly, spectral shapes can be adjusted by vertically providing layers of color filters that exhibit the same color though having different spectral transmittances for one unit pixel, as shown in B in FIG. 4. As described above, the layers of color filters provided in the vertical direction in each of the unit pixels constituting the pixel unit 200 exhibit the same color though having different spectral transmittance characteristics from each other, as shown in B in FIG. 4.

As described above, in the pixel unit 200, the layers (two layers in the example shown in A in FIG. 3) of color filters provided in the vertical direction in one unit pixel are color filters of the same color.

Referring back to A in FIG. 3, light that enters the on-chip lens 213-1 passes through the upper green color filter 223-1, the planarizing film 222, and the lower green color filter 221-1, and is collected on and enters the green photodiode 211-1. More accurately, of the light exiting from the on-chip lens 213-1, only the light in the green wavelength band passes through the upper green color filter 223-1, and further passes through the planarizing film 222. Further, only the light in the green wavelength band that has passed through the upper green color filter 223-1 and the planarizing film 222 passes through the lower green color filter 221-1, and then enters the green photodiode 211-1. The green photodiode 211-1 outputs an electrical signal at a level corresponding to the amount of the incident light or the amount of the received light.

Light that enters the on-chip lens 213-2 is collected on and enters the red photodiode 211-2 through the same path as above. In this case, however, of the light exiting from the on-chip lens 213-2, only the light in the red wavelength band passes through the upper red color filter 223-2 and the lower red color filter 221-2.

In each of the unit pixels constituting the pixel unit 200, layers (two layers in the example shown in A in FIG. 3) of color filters are arranged at a distance from each other in the vertical direction. With this arrangement, color mixing that occurs between an on-chip lens and a photodiode can be reduced, as shown in the next FIG. 5.

[Color Mixing Reduction by the Pixel Unit 200]

Figure 5:
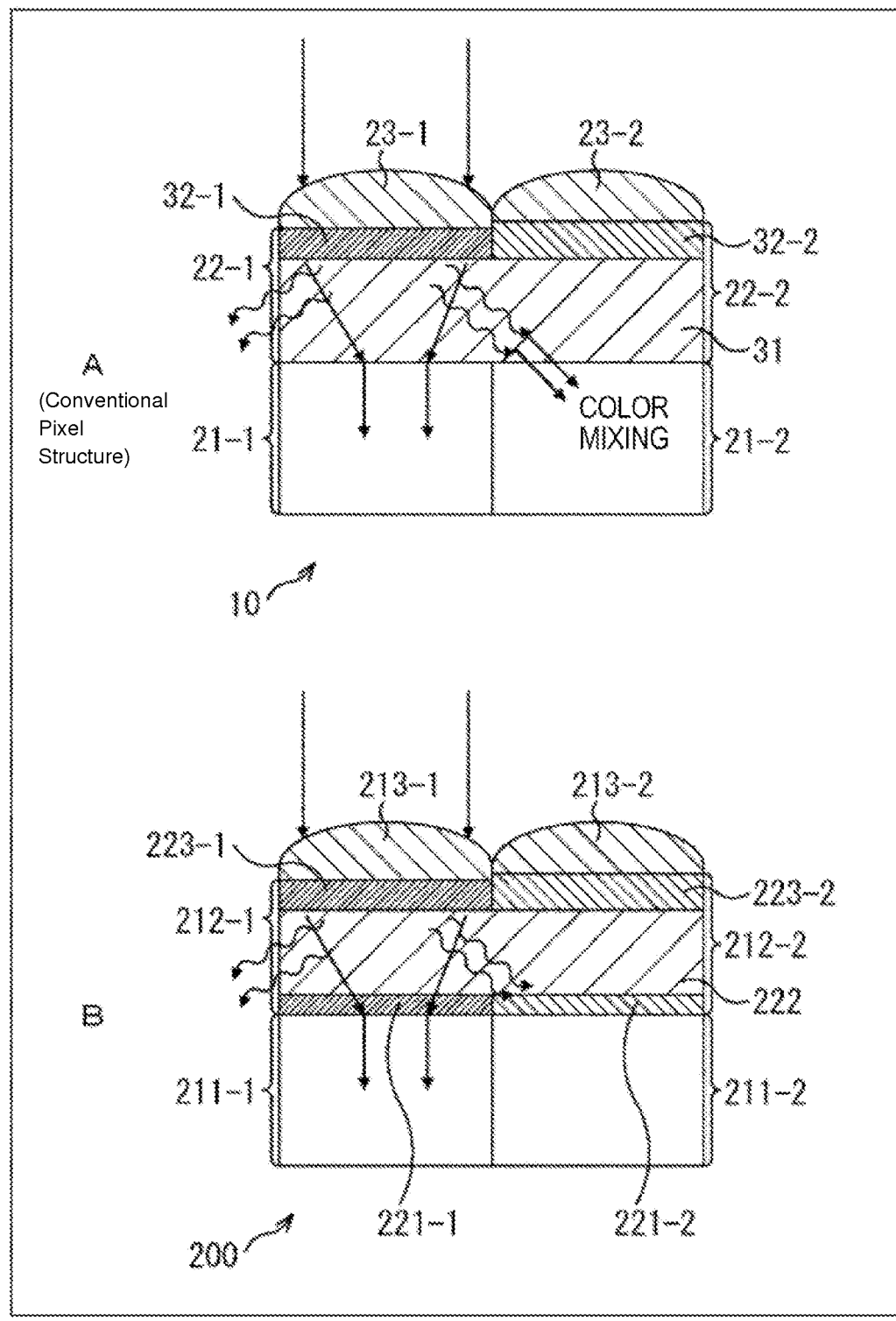
FIG. 5 shows diagrams for explaining a color mixing reduction.

FIG. 5 shows diagrams for explaining a color mixing reduction.

A in FIG. 5 is a cross-sectional view of the pixel unit 10 having a conventional structure. As shown in A in FIG. 5, of the light exiting from the on-chip lens 23-1, part of the light in the green wavelength band that has passed through the green color filter 32-1 leaks into the adjacent red photodiode 21-2, and the leakage light turns into a color mixing component to cause color mixing.

In the pixel unit 200 that is formed with the unit pixels to which the present technique is applied and is shown in B in FIG. 5, on the other hand, of the light exiting from the on-chip lens 213-1, part of the light in the green wavelength band that has passed through the upper green color filter 223-1 is substantially absorbed by the lower red color filter 221-2 before leaking into the red photodiode 211-2, and accordingly, the light to enter the red photodiode 211-2 is reduced. That is, the lower red color filter 221-2 passes only light in the red wavelength band, and therefore, the light in the green wavelength band that has passed through the upper green color filter 223-1 does not pass through the lower red color filter 221-2 but is substantially absorbed. Accordingly, the pixel unit 200 formed with the unit pixels to which the present technique is applied can reduce color mixing as shown in FIG. 6.

Figure 6:
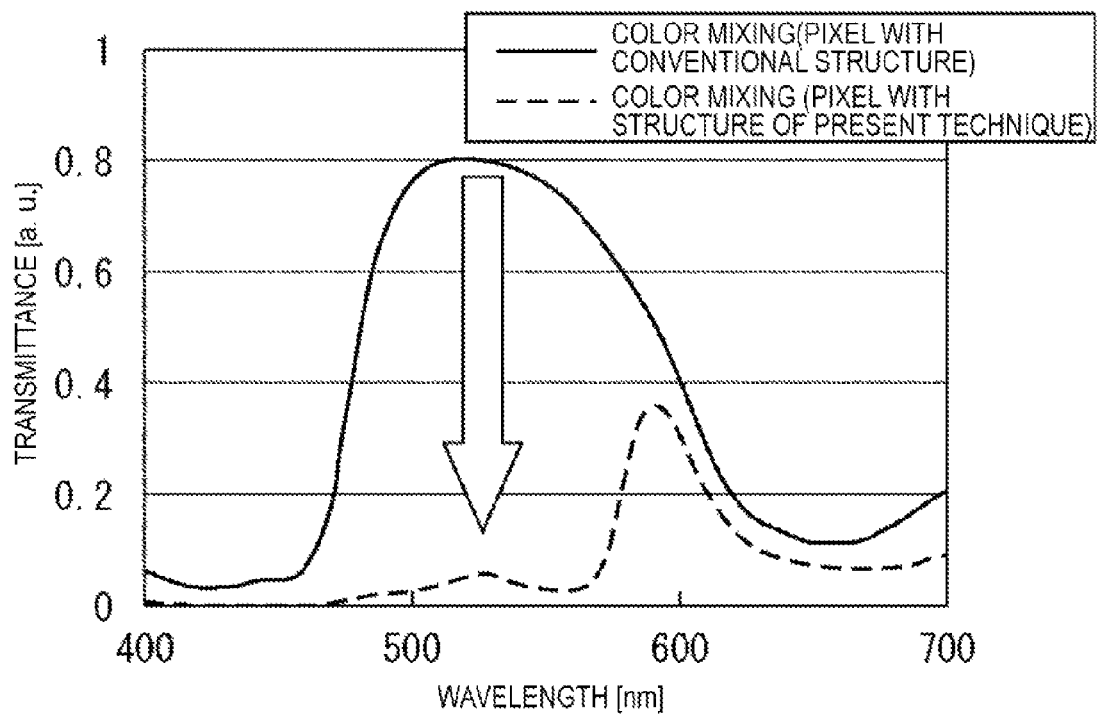
FIG. 6 is a graph showing the amounts of light entering a red photodiode with respect to the transmittance of a color filter.

FIG. 6 is a diagram showing the amount of light entering a red photodiode with respect to the transmittance of a color filter in a case where light that has transmitted through the green color filter enters the red photodiode and causes color mixing. In FIG. 6, the ordinate axis indicates transmittance, and the abscissa axis indicates wavelength.

Specifically, the amount of light that has a predetermined wavelength and enters the red photodiode becomes larger as the transmittance becomes higher. Accordingly, the amount of green light leaking into and entering the red photodiode, or the degree of influence on color mixing that occurs in the red photodiode, can be determined by the transmittance in a wavelength band around 520 nm.

The solid line in FIG. 6 indicates the spectral transmittance curve of the green color filter. In the pixel unit 10 having the conventional structure shown in A in FIG. 1, only one layer of the green color filter 32-1 having the characteristics indicated by the solid line in FIG. 6 is provided. Therefore, the solid line in FIG. 6 represents the amount of light leaking into and entering the adjacent red photodiode 21-2, or the degree of influence on color mixing that occurs in the red photodiode.

In the pixel unit 200 formed with the unit pixels to which the present technique is applied, on the other hand, the green light that has passed through the upper green color filter 223-1 enters the red photodiode 211-2 after passing through the lower red color filter 221-2. If the upper green color filter 223-1 has the characteristics represented by the solid line in FIG. 6, and the lower red color filter 221-2 has the characteristics represented by the dashed line in B in FIG. 4, the curve formed by combining the solid line in FIG. 6 and the dashed line in B in FIG. 4, or the dotted line in FIG. 6, represents the combined characteristics of the upper green color filter 223-1 and the lower red color filter 221-2. The dotted line in FIG. 6 represents the amount of light leaking into and entering the adjacent red photodiode 211-2, or the degree of influence on color mixing that occurs in the red photodiode, in the case where the present technique is applied.

As is apparent from a comparison between the conventional characteristics represented by the solid line in FIG. 6 and the characteristics of the present technique represented by the dotted line in FIG. 6, the characteristics represented by the dotted line in FIG. 6 exhibit a much higher transmittance in a wavelength band around 520 nm. This means that the amount of green light leaking into and entering the red photodiode, or the degree of influence on color mixing that occurs in the red photodiode, is might lower in the case where the present technique is applied than in a conventional case.

This is because, in the pixel unit 200 of the present technique, the green light that has passed through the upper green color filter 223-1 is absorbed by the lower red color filter 221-2 before leaking into the adjacent red photodiode 211-2.

As described above, color mixing that occurs between an on-chip lens and a photodiode can be reduced by arranging layers of color filters of the same color at a distance from each other in the vertical direction in each of the unit pixels constituting the pixel unit 200.

[Process of Manufacturing the Pixel Unit 200 in a Back-Illuminated Image Sensor]

Figure 7:
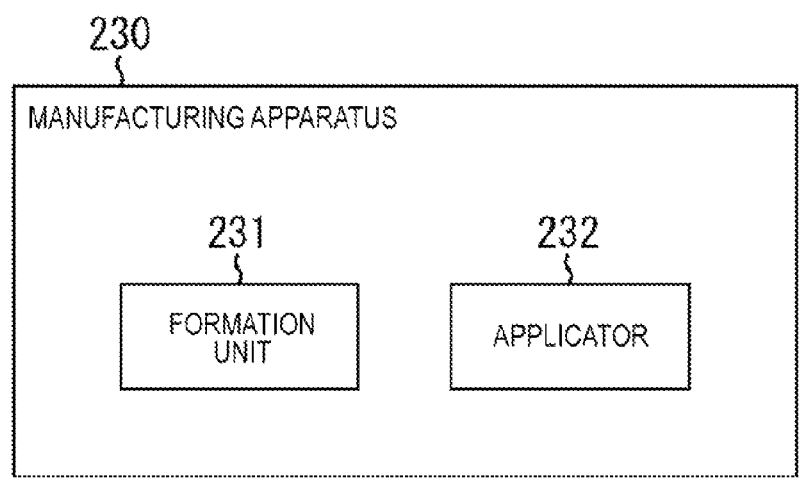
FIG. 7 is a block diagram showing an example functional structure of a manufacturing apparatus.
Figure 8:
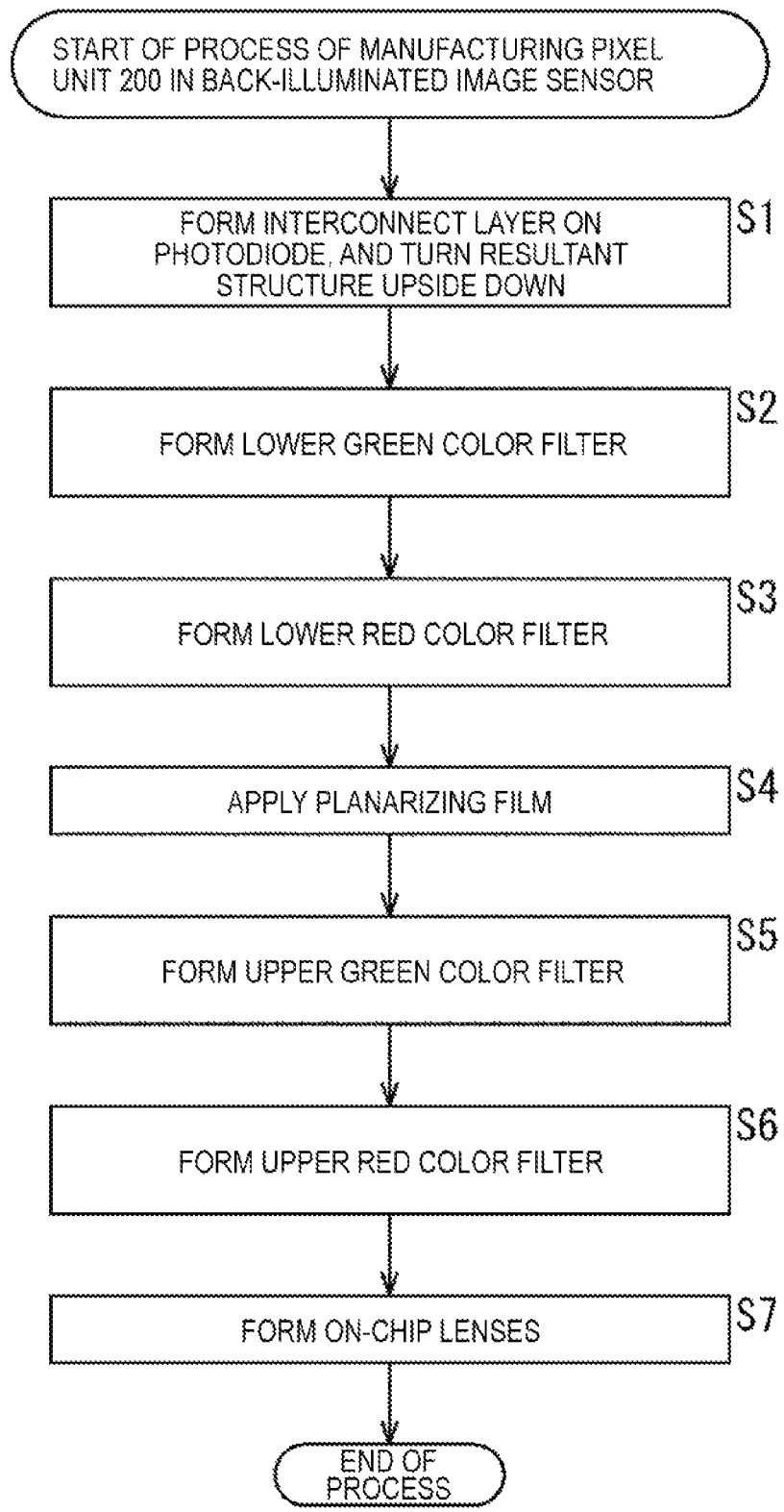
FIG. 8 is a flowchart for explaining a flow of a process of manufacturing a pixel unit.
Figure 9:
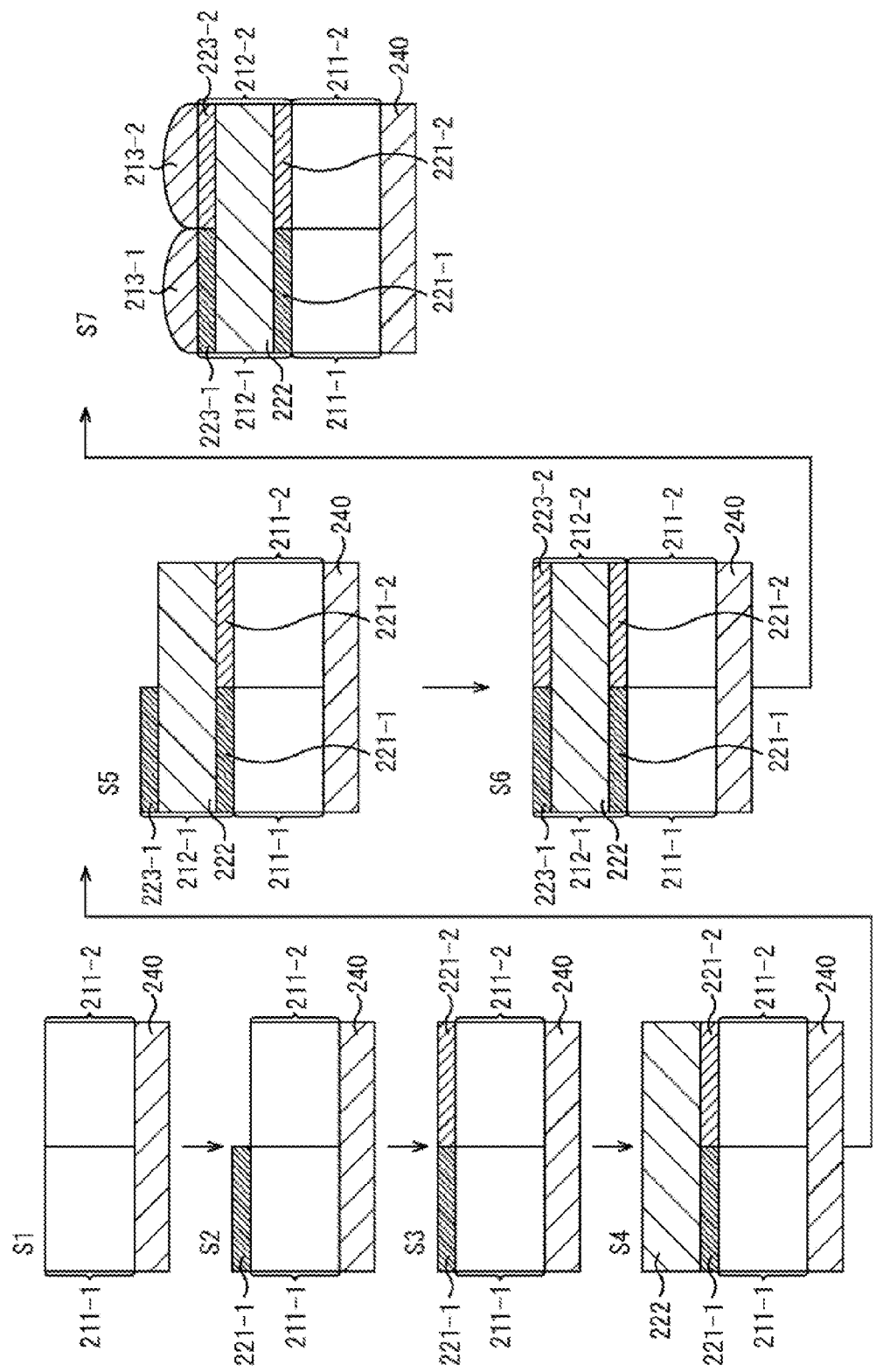
FIG. 9 is a diagram illustrating the flow of the process of manufacturing the pixel unit.

Referring now to FIGS. 7 through 9, a process of manufacturing the pixel unit 200 in a back-illuminated image sensor is described.

FIG. 7 is a block diagram showing an example functional structure of a manufacturing apparatus 230 that manufactures the pixel unit 200.

The manufacturing apparatus 230 includes a formation unit 231 and an applicator 232.

The formation unit 231 forms an interconnect layer, color filters, and on-chip lenses. The formation unit 232 also forms openings for a semiconductor substrate and an electrode as described later with reference to FIG. 15.

The applicator 232 applies a planarizing film.

FIG. 8 is a flowchart for explaining a flow of the process of manufacturing the pixel unit 200 in a back-illuminated image sensor. FIG. 9 is a diagram illustrating the flow of the process of manufacturing the pixel unit 200 in a back-illuminated image sensor. In the process of manufacturing the pixel unit 200, the pixel unit 200 might be manufactured manually or with apparatuses cooperating with one another. In this embodiment, however, the entire series of processes to manufacture the pixel unit 200 are performed by a single manufacturing apparatus, for ease of explanation.

In step S1, the formation unit 231 forms an interconnect layer 240 on the green photodiode 211-1 and the red photodiode 211-2, and turns the resultant structure upside down. This state is shown as state S1.

In step S2, the formation unit 231 forms the lower green color filter 221-1 on the green photodiode 211-1. This state is shown as state S2. Here, the lower green color filter 221-1 is formed through application of a color filter resist or by lithography.

In step S3, the formation unit 231 forms the lower red color filter 221-2 on the red photodiode 211-2. This state is shown as state S3. Here, the lower red color filter 221-2 is formed through application of a color filter resist or by lithography.

In step S4, the applicator 232 applies the planarizing film 222 onto the lower green color filter 221-1 and the lower red color filter 221-2. This state is shown as state S4.

In step S5, the formation unit 231 forms the upper green color filter 223-1 on the left-side portion of the planarizing film 222. This state is shown as state S5.

Here, the upper green color filter 223-1 is formed through application of a color filter resist or by lithography.

In step S6, the formation unit 231 forms the upper red color filter 223-2 on the right-side portion of the planarizing film 222. This state is shown as state S6. Here, the upper red color filter 223-2 is formed through application of a color filter resist or by lithography.

In step S7, the formation unit 231 forms the on-chip lens 213-1 and the on-chip lens 213-2 on the pair of the upper green color filter 223-1 and the upper red color filter 223-2. This state is shown as state S7.

At this point, the process of manufacturing the pixel unit 200 in a back-illuminated image sensor comes to an end.

It should be noted that, in step S4, the height of the pixel unit 200 is controlled by adjusting the thickness of the planarizing film 222 applied onto the pair of the lower green color filter 221-1 and the lower red color filter 221-2. Here, sensitivity, color mixing, and shading vary with the height of the pixel unit 200. Therefore, it is preferable to adjust the thickness of the planarizing film 222 so that the pixel unit 200 has such a height as to achieve the highest sensitivity and minimize occurrences of color mixing and shading.

[Application of Pupil Correction]

Pupil correction may be performed on the layers of color filters provided in the vertical direction in each of the unit pixels constituting the pixel unit 200, and the on-chip lenses. Pupil correction is disclosed in Japanese Patent Application Laid-Open No. 2010-232595, for example. The pixel unit described below basically has the same structure as the pixel unit 200 shown in A in FIG. 3, but the structure partially differs from that of the pixel unit 200. Therefore, only the aspects that differ from those of the structure shown in A in FIG. 3 will be explained below in the description of the structures of pixel units.

Figure 10:
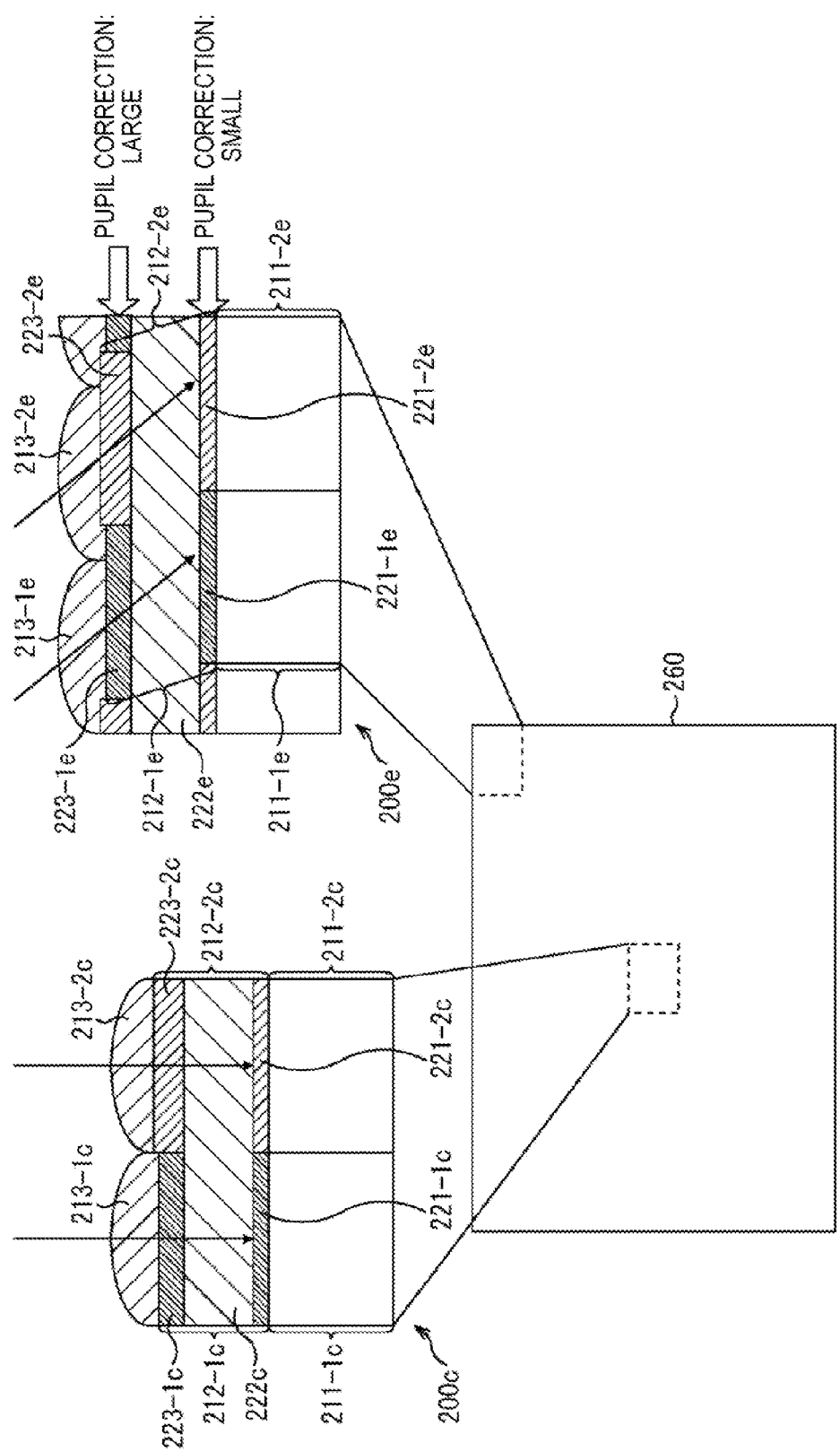
FIG. 10 is a diagram for explaining a pixel unit on which pupil correction has been performed.

FIG. 10 is a diagram for explaining a pixel unit formed with unit pixels on which pupil correction has been performed.

A pixel unit 200c is a pixel unit that is located at the center portion of an imaging device 260, and a pixel unit 200e is a pixel unit located at a corner portion of the imaging device 260.

Light traveling in the direction of the central axis of an on-chip lens 213-1c enters the pixel unit 200c located at the center portion of the imaging device 260. Therefore, light that has passed through an upper green color filter 223-1c, a planarizing film 222c, and a lower green color filter 221-1c vertically enters a green photodiode 211-1c. Likewise, light that has entered an on-chip lens 213-2c vertically enters a red photodiode 211-2c. Therefore, in the pixel unit 200c located at the center portion of the imaging device 260, pupil correction is not performed on the on-chip lenses 213-1c and 213-2c, and a green filter portion 212-1c and a red filter portion 212-2c.

In the pixel unit 200e that is located at a corner portion of the imaging device 260 and has light incident thereon from an oblique direction, on the other hand, light enters an on-chip lens 213-1e from a direction oblique to the central axis of the on-chip lens 213-1e. Therefore, light that has passed through an upper green color filter 223-1e, a planarizing film 222e, and a lower green color filter 221-1c obliquely enters a green photodiode 211-1e. Likewise, light that has entered an on-chip lens 213-2e obliquely enters a red photodiode 211-2e. That is, incident light is not efficiently collected on the green photodiode 211-1e and the red photodiode 211-2e. So as to efficiently collect light entering from an oblique direction, an amount of pupil correction in accordance with the incidence angle of light is performed on the on-chip lenses 213-1e and 213-2e, and the green filter portion 212-1e and the red filter portion 212-2e.

In other words, pupil correction is performed on pixel units 200 provided in the imaging device 260 so that the amount of pupil correction becomes larger in the directions from the center portion toward the corner portions of the imaging device 260. In each pixel unit 200, pupil correction is performed on the on-chip lenses 213-1e and 213-2e, and the green filter portion 212-1 and the red filter portion 212-2 so that the amount of pupil correction becomes larger at components located further away from the green photodiode 211-1 and the red photodiode 211-2. Specifically, in the pixel unit 200e, pupil correction is performed on the pixel unit 200e so that the amount of pupil correction becomes larger in the following order: the pair of the lower green color filter 221-1e and the lower red color filter 221-2e, the pair of the upper green color filter 223-1e and the upper red color filter 223-2e, and the pair of the on-chip lenses 213-1e and 213-2e. It should be noted that an amount of pupil correction means the shift amount of color filters and an on-chip lens with respect to the center of a photodiode.

As described above, pupil correction is also performed on the on-chip lenses and the color filters of each of the unit pixels constituting the pixel units 200 provided in the imaging device 260. Accordingly, the imaging device 260 can achieve a high sensitivity and reduce occurrences of color mixing at the corners of the field.

[Modification of the Number of Color Filters]

In the above described examples, the numbers of color filter layers provided in the unit pixels constituting a pixel unit are the same among the unit pixels of all the colors. However, the number of color filter layers provided in unit pixels may vary with color.

Figure 11:
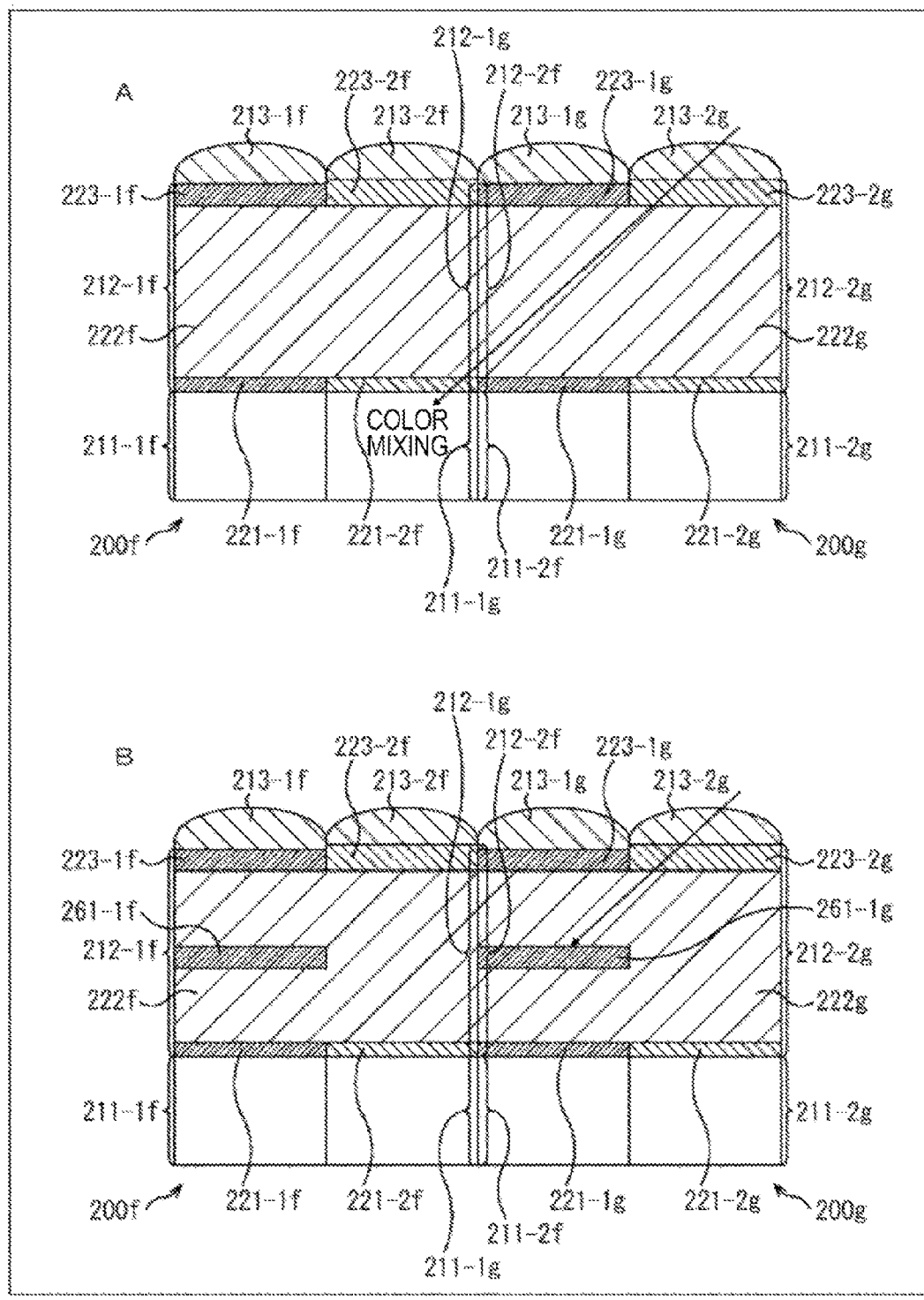
FIG. 11 shows diagrams for explaining pixel units formed with unit pixels in which the number of color filter layers varies with color.

FIG. 11 shows diagrams for explaining pixel units formed with unit pixels in which the number of color filter layers varies with color.

A in FIG. 11 is a cross-sectional view of a pixel unit 200f and a pixel unit 200g adjacent to the pixel unit 200f.

As shown in A in FIG. 11, in the pixel units 200f and 200g, respective planarizing films 222f and 222g are thick, and the distance between on-chip lenses and photodiodes is long. In this case, color mixing might occur, with one unit pixel being crossed.

Specifically, as shown in A in FIG. 11, of the light exiting from an on-chip lens 213-2g, part of the light that has passed through an upper red color filter 223-2g might leak into the red photodiode 211-2f of the red unit pixel of the adjacent pixel unit 200f. That is, the light exiting from the on-chip lens 213-2g of the red unit pixel of the pixel unit 200g might cross the green unit pixel of the pixel unit 200g, and leak into the red photodiode 211-2f of the red unit pixel of the adjacent pixel unit 200f. The leakage light might turn into a color mixing component to cause color mixing. In this case, even if the light to leak into the red photodiode 211-2f of the red unit pixel is light in red (the same color) that has passed through the red color filter 223-2g, resolution degradation or the like might occur.

To reduce color mixing that occurs as described above, the numbers of the color filter layers provided in the pixel units 200*f* and 200*g* are increased for the respective colors.

B in FIG. 11 is a cross-sectional view of a pixel unit 200*f* formed with unit pixels in which the number of color filter colors varies with color, and a pixel unit 200*g* adjacent to the pixel unit 200*f*. As shown in B in FIG. 11, in the pixel units 200*f* and 200*g*, intermediate green color filters 261-1*f* and 261-1*g* are added to the pixel units shown in A in FIG. 11.

Specifically, as shown in B in FIG. 11, of the light exiting from the on-chip lens 213-2*g* of the red unit pixel of the pixel unit 200*g*, part of the light in the red wavelength band that has passed through the upper red color filter 223-2*g* might leak into the red photodiode 211-2*f* of the red unit pixel of the adjacent pixel unit 200*f*. Even so, the leakage light is substantially absorbed by the intermediate green color filter 261-1*g*. Accordingly, light to leak into the red photodiode 211-2*f* of the red unit pixel of the adjacent pixel unit 200*f* is reduced. That is, as the intermediate green color filter 261-1*g* passes only light in the green wavelength band, light in the red wavelength band that has passed through the upper red color filter 223-2*g* does not pass through the intermediate green color filter 261-1*g* but is substantially absorbed. Accordingly, light to leak into the red photodiode 211-2*f* is reduced.

As described above, color mixing caused by light leaking across one unit pixel can be reduced by varying the numbers of color filters provided in the unit pixels constituting a pixel unit 200 with color. It is of course possible to increase the number of the color filters of the unit pixel of another color, and the number of the color filters to be provided is not limited to that mentioned in the example described above.

[Another Modification of the Number of Color Filters]

In the above described examples, more than one color filter layer is provided in each of the unit pixels constituting a pixel unit. However, more than one color filter layer may be provided only in one of the unit pixels constituting a pixel unit.

Figure 12:
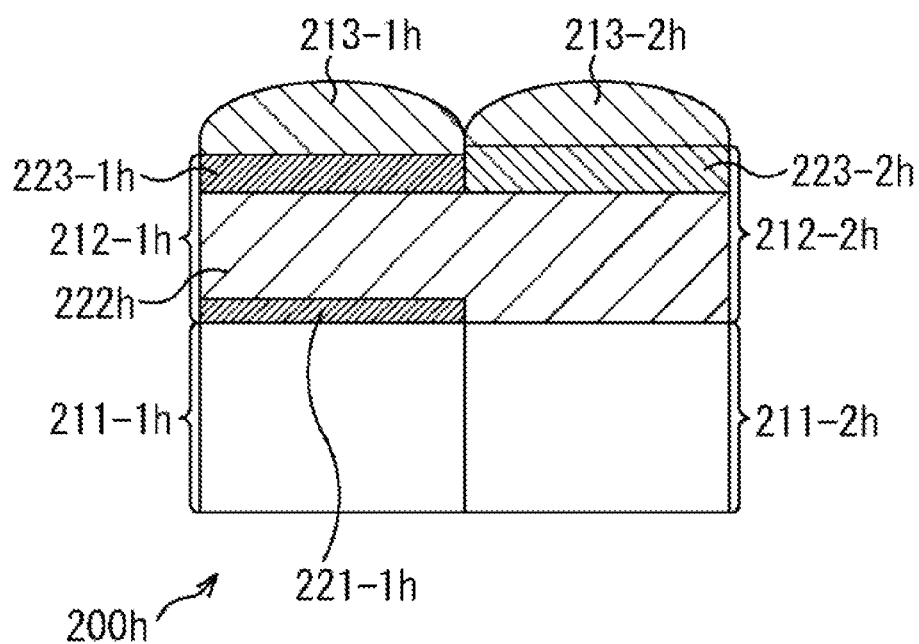
FIG. 12 is a cross-sectional view of a pixel unit in which more than one color filter layer is provided only for one color.

FIG. 12 is a cross-sectional view of a pixel unit 200*h* formed with unit pixels in which more than one color filter layer is provided only for one color. As shown in FIG. 12, a green filter portion 212-1*h* is formed by stacking a lower green color filter 221-1*h*, the left-side portion of a planarizing film 222*h*, and an upper green color filter 223-1*h*, in this order from the bottom. Meanwhile, a red filter portion 212-2*h* is formed by stacking the right-side portion of the planarizing film 222*h* and an upper red color filter 223-2*h* in this order from the bottom.

That is, in the pixel unit 200*h*, only one red color filter 223-2*h* is provided in the red unit pixel as in a unit pixel having a conventional structure. On the other hand, the green color filters 221-1*h* and 223-1*h* are provided in the green unit pixel. In this case, of the light in the red wavelength band that has transmitted through the red color filter 223-2*h*, the light to leak into a green photodiode 211-1*h* can be reduced. Of the light in the green wavelength band that has passed through the green color filter 223-1*h*, on the other hand, the light to leak into a red photodiode 211-2*h* is not easily reduced.

However, the number of procedures in the process of manufacturing the pixel unit 200*h* can be made smaller by reducing the number of color filters to be provided in the unit pixels. In this manner, costs can be lowered. Accordingly, the designer of pixel units preferably determines the number of color filters to be provided in each of the unit pixels constituting a pixel unit, taking into account a balanced relationship between the amount of color mixing and costs. It is of course possible to provide more than one color filter layer only for the unit pixel of another color.

[Example Locations of Color Filters]

In the above described examples, the color filters provided in the unit pixels constituting a pixel unit are located directly on photodiodes. However, color filters are not necessarily located directly on photodiodes in a case where steps are formed on the photodiodes in unit pixels, for example.

Figure 13:
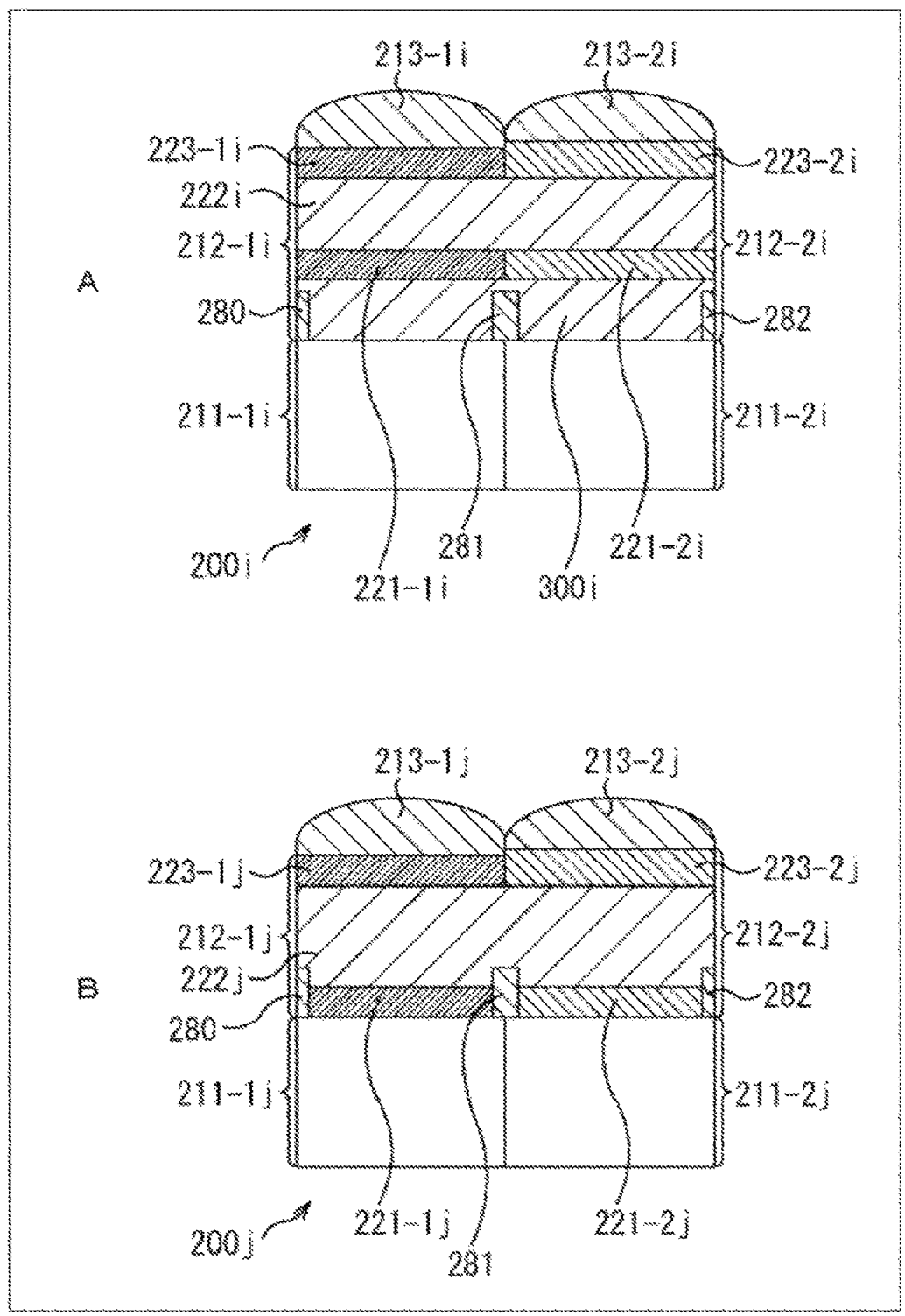
FIG. 13 shows cross-sectional views of pixel units in cases where steps are formed on photodiodes.

FIG. 13 shows cross-sectional views of pixel units in cases where steps are formed on photodiodes. In a case where steps are formed, some other components are placed on photodiodes, for example. In the examples shown in FIG. 13, metallic light shielding films 280 through 282 are provided on the photodiodes of pixel units.

Specifically, as shown in A in FIG. 13, a planarizing film 300*i* is first applied onto a green photodiode 211-1*i* and a red photodiode 211-2*i* of a pixel unit 200*i*, to planarize the surfaces of the green photodiode 211-1*i* and the red photodiode 211-2*i*. After that, a pair of a lower green color filter 221-1*i* and a lower red color filter 221-2*i* may be provided.

Also, as shown in B in FIG. 13, a pair of a lower green color filter 221-1*j* and a lower red color filter 221-2*j* may be provided between the metallic light shielding films 280 through 282 provided on the photodiodes of a pixel unit 200*j*. Specifically, the lower green color filter 221-1*j* may be provided between the metallic light shielding film 280 and the metallic light shielding film 281, and the lower red color filter 221-2*j* may be provided between the metallic light shielding film 281 and the metallic light shielding film 282.

As described above, even in cases where steps are formed on the photodiodes of the unit pixels constituting a pixel unit, layers of color filters can be provided. Accordingly, color mixing can be reduced.

[Example where a White Pixel is Used]

In the above described examples, a pixel unit is formed with unit pixels of three colors, which are a red unit pixel, a green unit pixel, and a blue unit pixel, for example. However, a white unit pixel may be used as a color unit pixel of a pixel unit. White unit pixels are disclosed in Japanese Patent Application Laid-Open No. 2009-296276, for example. A white unit pixel is formed with components such as a photodiode, a transparent filter, and an on-chip lens. Alternatively, a white unit pixel may include neither a transparent filter nor any color filter. In each of the example pixel units shown in FIG. 14, only a pair of a green unit pixel and a white unit pixel is provided, for ease of explanation.

Figure 14:
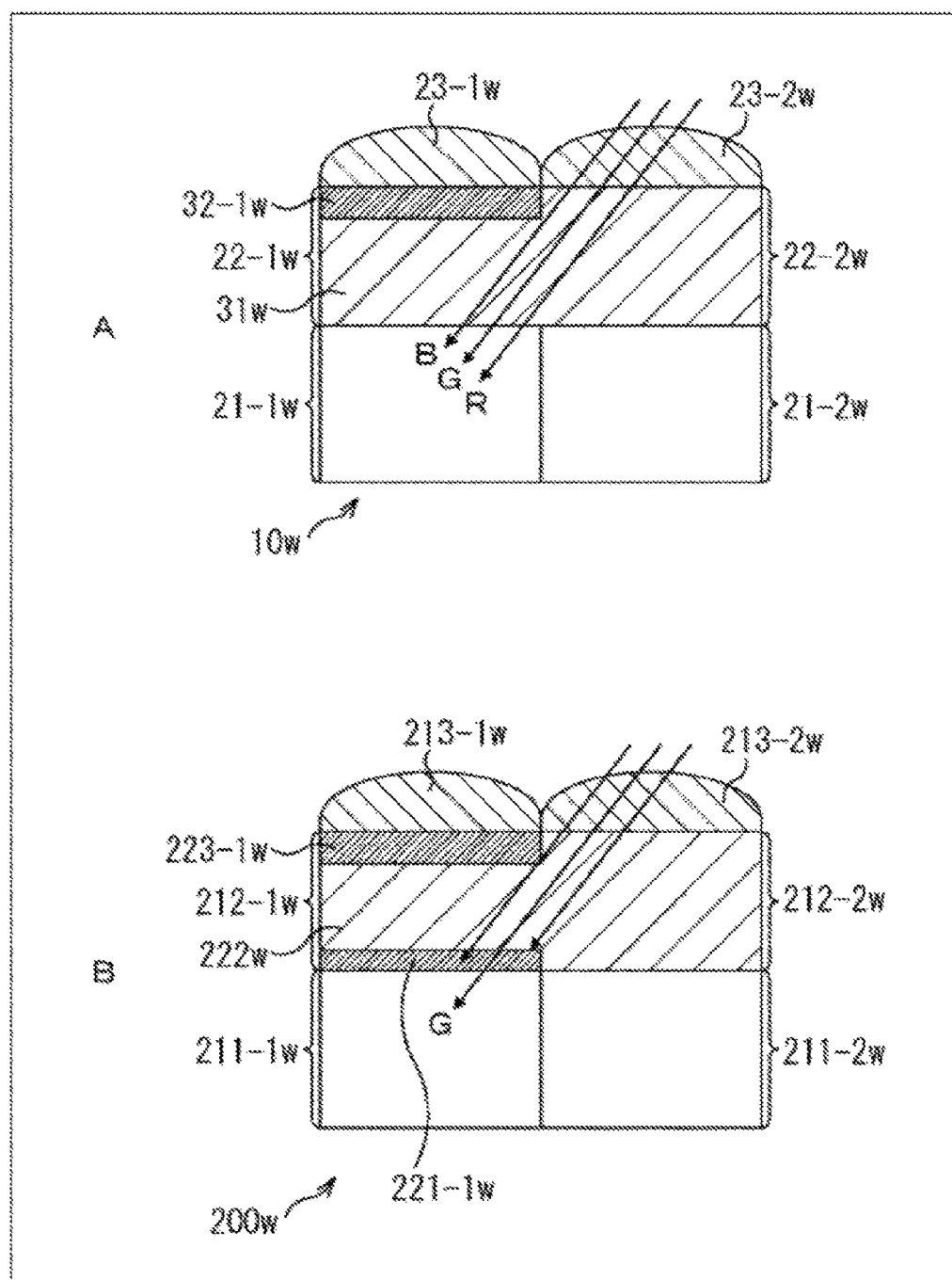
FIG. 14 shows diagrams for explaining pixel units in which a white unit pixel is used.

FIG. 14 shows diagrams for explaining pixel units in which a white unit pixel is used.

A in FIG. 14 is a cross-sectional view of a pixel unit 10*w* having a conventional structure in which a white unit pixel is used. In the pixel unit 10*w*, a green photodiode 21-1*w* and a white photodiode 21-2*w* are arranged adjacent to each other. A green filter portion 22-1*w* and an on-chip lens 23-1*w* are stacked, in this order from the bottom, on the green photodiode 21-1*w*. A white filter portion 22-2*w* and an on-chip lens 23-2*w* are stacked, in this order from the bottom, on the white photodiode 21-2*w*.

The green filter portion 22-1*w* is formed by stacking the left-side portion of a planarizing film 31*w* and a green color filter 32-1*w* in this order from the bottom. The white filter portion 22-2*w* is formed with the right-side portion of the planarizing film 31*w*. That is, the white filter portion 22-2*w* does not include any color filter.

B in FIG. 14 is a cross-sectional view of a pixel unit 200*w* that is formed with unit pixels according to the present technique and includes a white unit pixel. In the pixel unit 200*w*, a green photodiode 211-1*w* and a white photodiode 211-2*w* are arranged adjacent to each other. A green filter portion 212-1*w* and an on-chip lens 213-1*w* are stacked, in this order from the bottom, on the green photodiode 211-1w. A white filter portion 212-2w and an on-chip lens 213-2w are stacked, in this order from the bottom, on the white photodiode 211-2w.

The green filter portion 212-1w is formed by stacking a lower green color filter 221-1w, the left-side portion of a planarizing film 222w, and an upper green color filter 223-1w, in this order from the bottom. The white filter portion 212-2w is formed with the right-side portion of the planarizing film 222w. That is, the white filter portion 212-2w does not include any color filter.

As shown in A in FIG. 14, in the pixel unit 10w that includes a white unit pixel and has a conventional structure, part of red light, green light, and blue light exiting from the on-chip lens 23-2w leaks into the adjacent green photodiode 21-1w, and the leakage red light, green light, and blue light turn into color mixing components to cause color mixing.

In the pixel unit 200w formed with unit pixels according to the present technique as shown in B in FIG. 14, on the other hand, the red light and the blue light of part of red light, green light, and blue light exiting from the on-chip lens 213-2w are substantially absorbed by the lower green color filter 221-1w before leaking into the adjacent green photodiode 211-1w, and only the green light passes through. Accordingly, the light to enter the green photodiode 211-2w is reduced. Specifically, as the lower green color filter 221-1w passes only light in the green wavelength band, the red light and the blue light of red light, green light, and blue light exiting from the on-chip lens 213-2w do not pass through the lower green color filter 221-1w but are substantially absorbed. Accordingly, the amount of mixing color components can be reduced. Accordingly, the pixel unit 200w formed with the unit pixels to which the present technique is applied can reduce color mixing. It is of course possible to provide more than one color filter layer in the unit pixel of any color other than green.

The present technique can be applied to pixels to be provided in a CMOS image sensor or a CCD (Charge Coupled Device) image sensor. The present technique can also be applied to pixels to be arranged in a Beyer pattern, a ClearVid pattern, or some other pattern. The material of the color filters to be provided in unit pixels of the present technique may be either a pigment material or a dye material. Also, unit pixels of the present technique can be used not only in back-illuminated image sensors but also in front-illuminated image sensors shown in FIG. 15.

[Unit Pixels of the Present Technique Used in Front-Illuminated Image Sensors]

Figure 15:
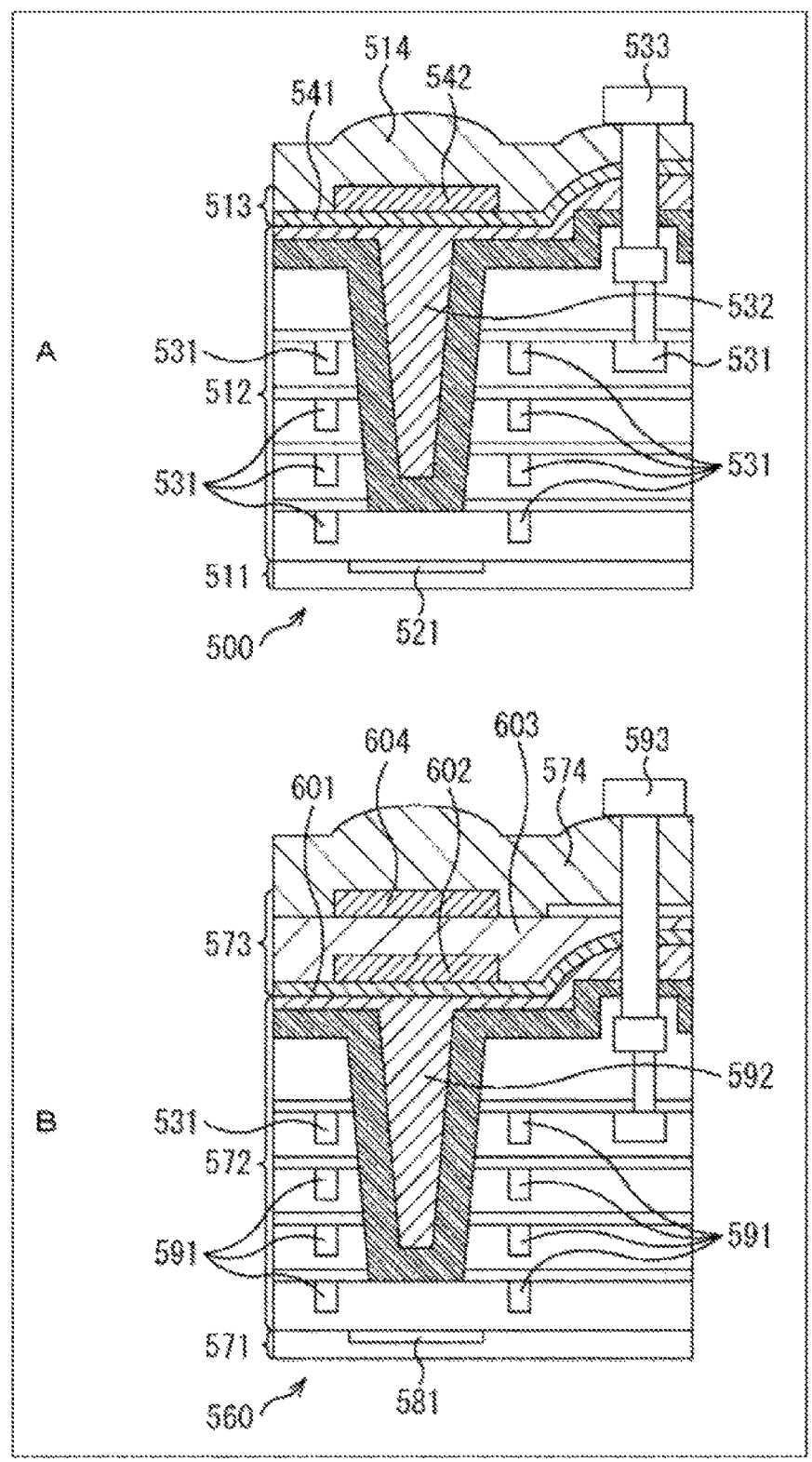
FIG. 15 shows cross-sectional views of unit pixels used in front-illuminated image sensors.

FIG. 15 shows cross-sectional views of unit pixels used in front-illuminated image sensors. Front-illuminated image sensors are disclosed in Japanese Patent Application Laid-Open Nos. 2010-232595 and 2010-41034, for example.

A in FIG. 15 is a cross-sectional view of a unit pixel 500 that is used in an imaging device of a front-illuminated image sensor and has a conventional structure. In the unit pixel 500, a semiconductor substrate 511, an interconnect layer 512, a filter portion 513, and an on-chip lens 514 are stacked in this order from the bottom.

A photodiode 521 is provided in the semiconductor substrate 511. The interconnect layer 512 includes interconnects 531, a waveguide 532, and an opening 533 for an electrode. The filter portion 513 is formed by stacking a planarizing film 541 and a color filter 542 in this order from the bottom. That is, only one layer of the color filter 542 is provided in the unit pixel 500.

Light that enters the on-chip lens 514 passes through the color filter 542 and the planarizing film 541, and enters the photodiode 521 through the waveguide 532. Of the light exiting from the on-chip lens of an adjacent unit pixel (not shown), the light that has passed through the color filter of the adjacent unit pixel (not shown) leaks into the upper portion of the waveguide 532. The leakage light then enters the photodiode 521 through the waveguide 532, and causes color mixing therein. Color mixing might result in a reduction in S/N or color reproducibility. Therefore, to reduce color mixing, layers of color filters may be provided in one unit pixel, as shown in B in FIG. 15.

B in FIG. 15 is a cross-sectional view of a unit pixel 560 that is used in a front-illuminated image sensor and has the present technique applied thereto. In the unit pixel 560, a semiconductor substrate 571, an interconnect layer 572, a filter portion 573, and an on-chip lens 574 are stacked in this order from the bottom.

A photodiode 581 is provided in the semiconductor substrate 571. The interconnect layer 572 includes interconnects 591, a waveguide 592, and an opening 593 for an electrode. The filter portion 573 is formed by stacking a first planarizing film 601, a lower color filter 602, a second planarizing film 603, and an upper color filter 604, in this order from the bottom. That is, in the unit pixel 560, layers (two layers in the example shown in B in FIG. 15) of color filters of the same color, which are the lower color filter 602 and the upper color filter 604, are provided in the vertical direction.

Light that enters the on-chip lens 574 passes through the upper color filter 604, the second planarizing film 603, the lower color filter 602, and the first planarizing film 601, and then enters the photodiode 581 through the waveguide 592.

In the unit pixel 560, of light exiting from the on-chip lens of an adjacent unit pixel (not shown), the light that has passed through the upper color filter of the adjacent unit pixel (not shown) might leak into the unit pixel 560. Even so, the leakage light is substantially absorbed by the lower color filter 602. Accordingly, leakage into the upper layer of the waveguide 592 can be reduced, and the light to enter the photodiode 581 is reduced. As the lower color filter 602 passes only light in a specific first wavelength band, light in a specific second wavelength band that has passed through a color filter of the adjacent unit pixel (not shown) does not pass through the lower color filter 602 but is substantially absorbed. Accordingly, the unit pixel 560 to which the present technique is applied can reduce color mixing.

[Process of Manufacturing the Pixel Unit 560 in a Front-Illuminated Image Sensor]

Figure 16:
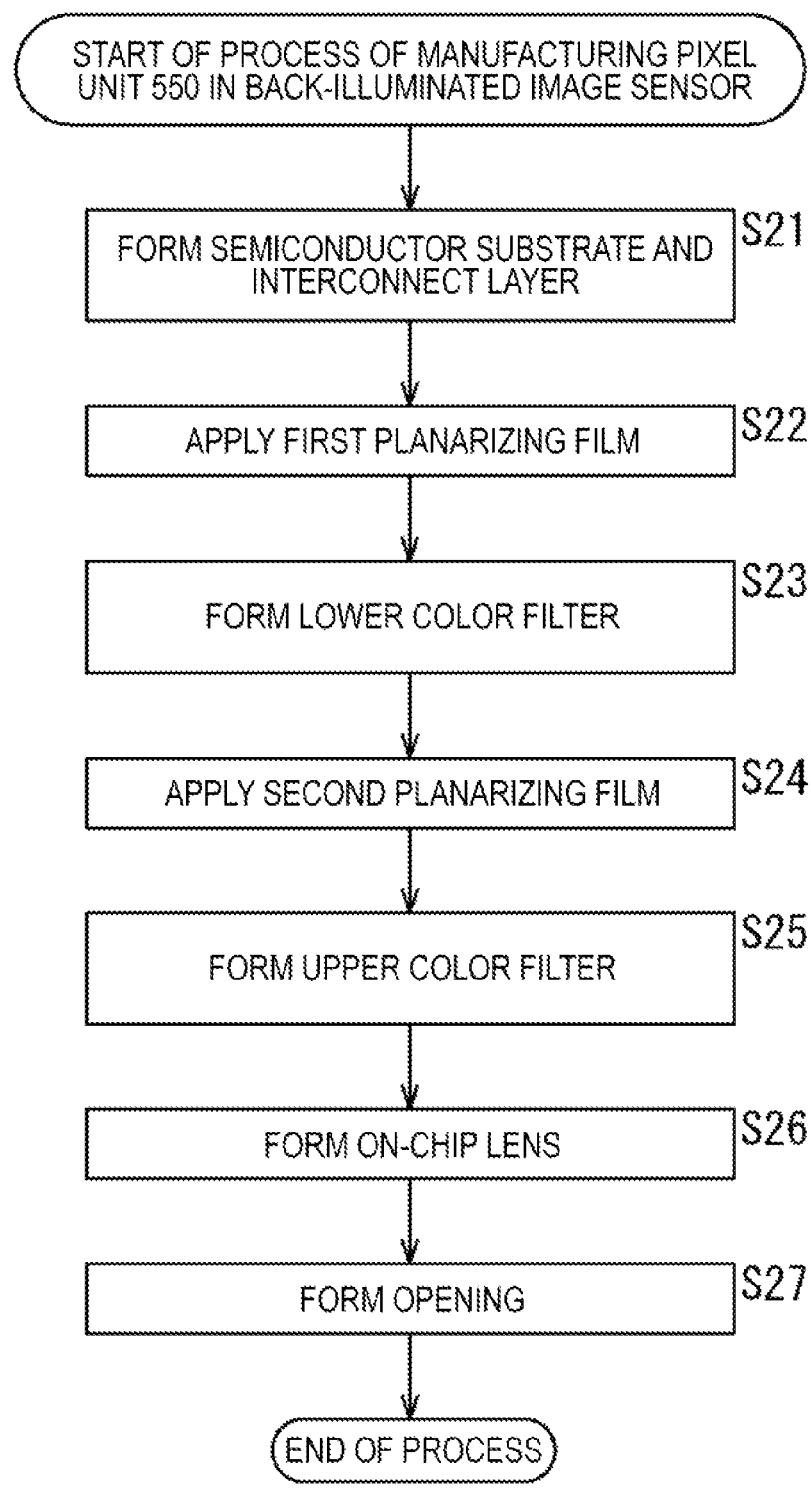
FIG. 16 is a flowchart for explaining a flow of a process of manufacturing a pixel unit.
Figure 17:
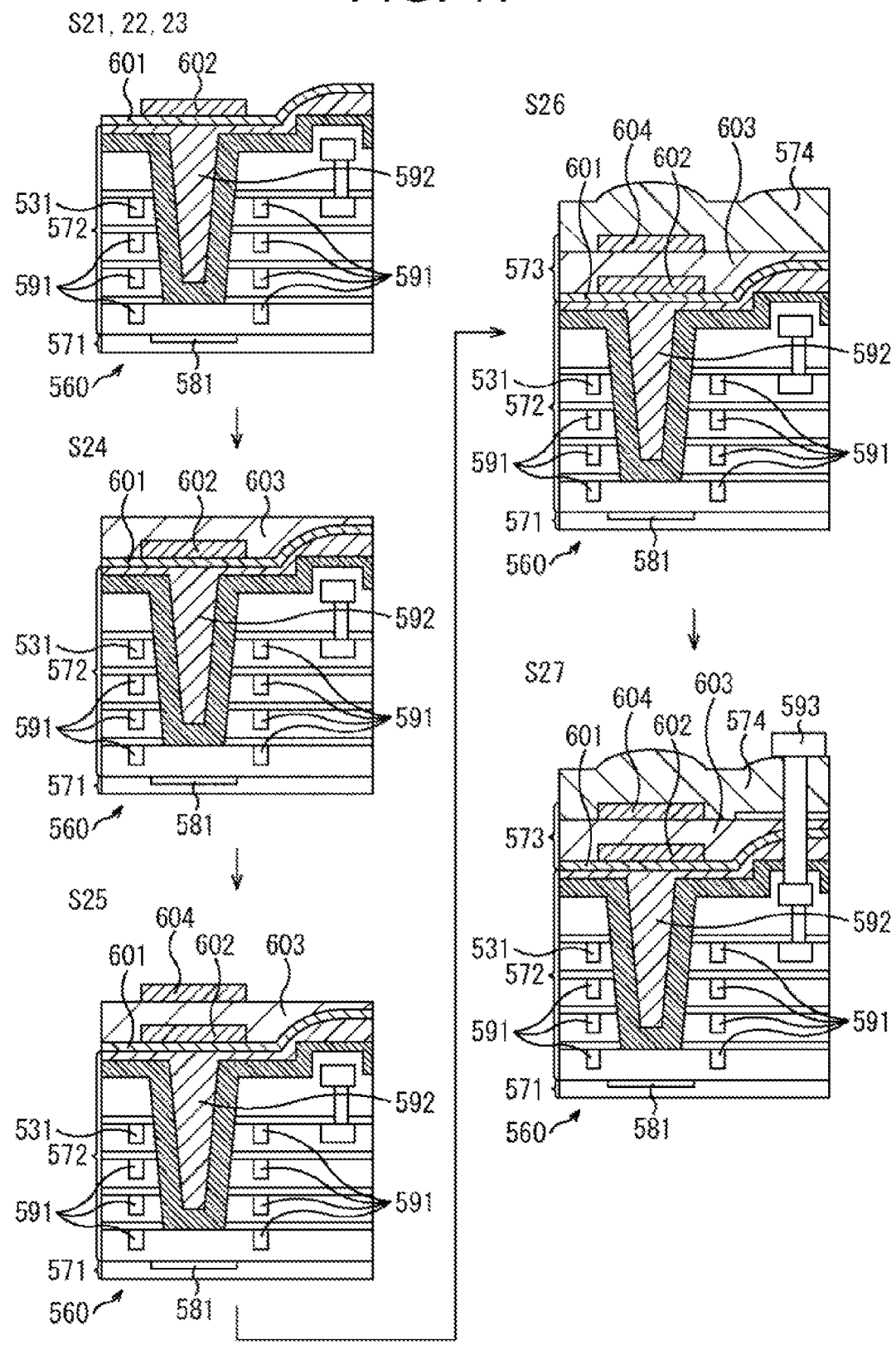
FIG. 17 is a diagram illustrating the flow of the process of manufacturing the pixel unit.

Referring now to FIGS. 16 and 17, a process of manufacturing the pixel unit 560 to be used in an imaging device of a front-illuminated image sensor is described.

FIG. 16 is a flowchart for explaining a flow of the process of manufacturing the pixel unit 560 in a front-illuminated image sensor. FIG. 17 is a diagram illustrating the flow of the process of manufacturing the pixel unit 560 in a front-illuminated image sensor. In the process of manufacturing the pixel unit 560, the pixel unit 560 might be manufactured manually or with apparatuses cooperating with one another. In this embodiment, however, the entire series of processes to manufacture the pixel unit 560 are performed by a single manufacturing apparatus 230, for ease of explanation.

In step S21, the formation unit 231 forms the semiconductor substrate 571 and the interconnect layer 572. In step S22, the applicator 232 applies the first planarizing film 601 onto the interconnect layer 572. In step S23, the formation unit 231 forms the lower color filter 602 on the first planarizing film 601. This state is shown as states S21, S22, and S23.

In step S24, the applicator 232 applies the second planarizing film 603 onto the lower color filter 602. This state is shown as state S24.

In step S25, the formation unit 231 forms the upper color filter 604 on the second planarizing film 603. This state is shown as state S25.

In step S26, the formation unit 231 forms the on-chip lens 574 on the upper color filter 604. This state is shown as state S26.

In step S27, the formation unit 231 forms the opening 593 for an electrode. This state is shown as state S27.

At this point, the process of manufacturing the pixel unit 560 in a front-illuminated image sensor comes to an end.

As described above, color mixing that occurs between an on-chip lens and a photodiode can be reduced by providing layers of color filters of the same color at a distance from each other in the vertical direction in one unit pixel. As color mixing decreases, a high S/N and a high color reproducibility can be realized. Furthermore, as light leakage from adjacent pixels is reduced, a higher resolution can be achieved.

[Imaging Apparatus]

Figure 18:
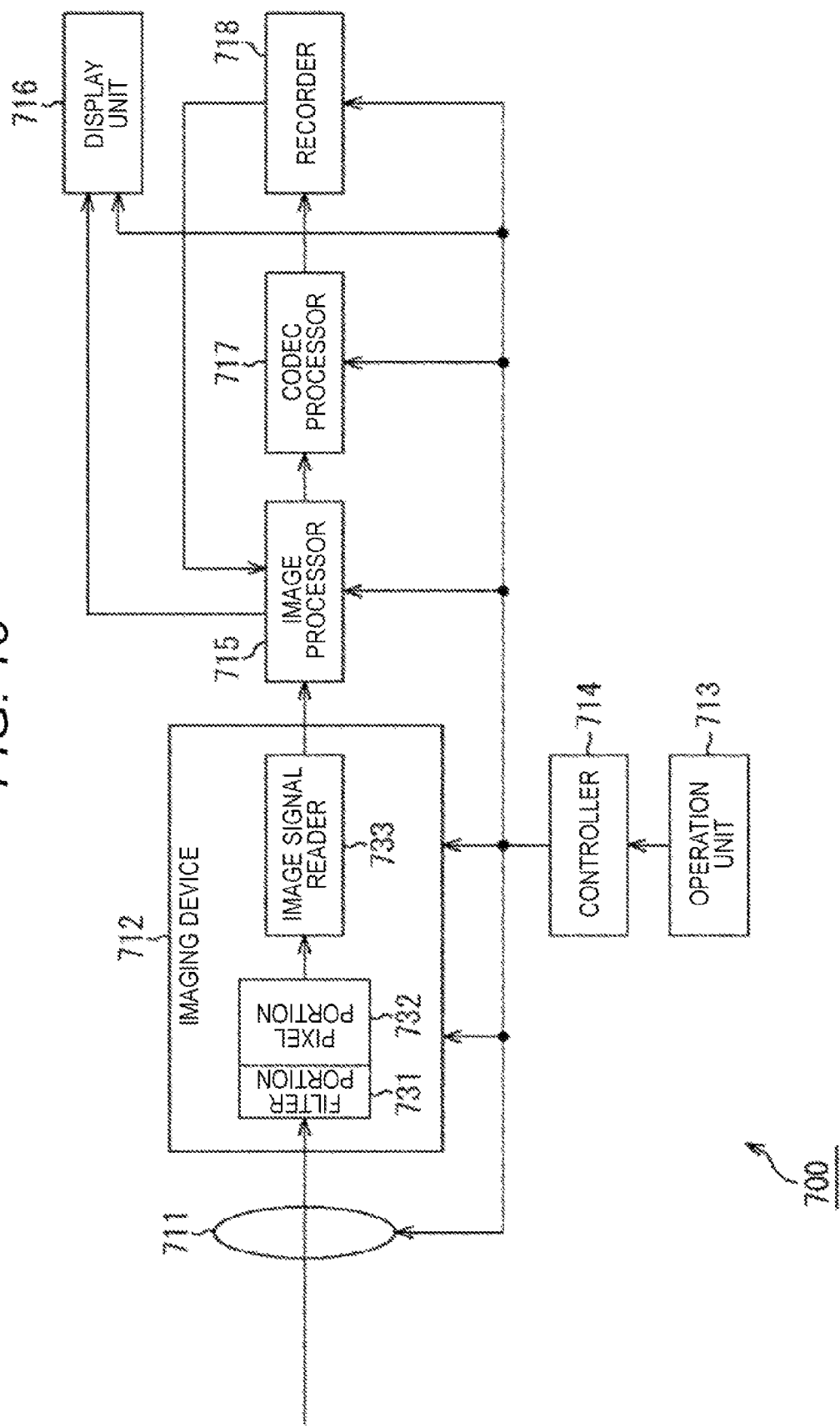
FIG. 18 is a block diagram showing a typical example structure of an imaging apparatus to which the present technique is applied.

FIG. 18 is a block diagram showing an imaging apparatus including an imaging device formed with pixel units to which the present invention described above is applied, or a typical example structure of an imaging device to which the present technique is applied.

As shown in FIG. 18, an imaging apparatus 700 includes a lens unit 711, an imaging device 712, an operation unit 713, a controller 714, an image processor 715, a display unit 716, a codec processor 717, and a recorder 718.

The lens unit 711 adjusts a focus on an object, collects light from the position brought into focus, and supplies the collected light to the imaging device 712.

The imaging device 712 includes a filter portion 731, a pixel portion 732, and a pixel signal reader 733.

The filter portion 731 and the pixel portion 732 constitute an assembly of pixel units 200 (see FIG. 3) to which the above described present technique is applied. From the viewpoint of a pixel unit 200, the on-chip lens 213-1 and the green filter portion 212-1, and the on-chip lens 213-2 and the red filter portion 212-2 constitute part of the filter portion 731. The green photodiode 211-1 and the red photodiode 211-2 constitute part of the pixel portion 732. In other words, the assembly of the on-chip lenses 213-1 and the green filter portions 212-2, and the on-chip lenses 213-2 and the red filter portions 212-2 of the respective pixel units 200 forms the filter portion 731. The assembly of the green photodiodes 211-1 and the red photodiodes 211-2 of the respective pixel units 200 forms the pixel portion 732.

The pixel portion 732 receives light that enters through the lens 711 and the filter portion 731, photoelectrically converts the light, and outputs a voltage signal (an analog signal) in accordance with intensity of the light. The pixel signal reader 733 reads the analog signal of each pixel as a pixel signal from the pixel portion 732, performs A/D (Analog-Digital) conversion on each pixel signal, and supplies each resultant pixel signal as a digital signal to the image processor 715.

The operation unit 713 is formed with a Jog Dial (a trade name), keys, buttons, a touch panel, and the like, receives an operation input from a user, and supplies a signal according to the operation input to the controller 714.

Based on the signal corresponding to the user's operation input from the operation unit 713, the controller 714 controls the lens unit 711, the imaging device 712, the image processor 715, the display unit 716, the codec processor 717, and the recorder 718.

The image processor 715 performs various kinds of image processing, such as white balance adjustment, demosaicing, matrix processing, gamma correction, and YC conversion, on an image signal supplied from the imaging device 712, and supplies the resultant signal to the display unit 716 and the codec processor 717.

The display unit 716 is designed as a liquid crystal display, for example, and displays an image of the object based on the image signal from the image processor 715.

The codec processor 717 performs an encoding process on the image signal from the image processor 715, and supplies the image data obtained as a result of the encoding process to the recorder 718.

The recorder 718 records the image data supplied from the codec processor 717. The image data recorded in the recorder 718 is read by the image processor 715 when necessary, and is supplied to the display unit 716 to display the corresponding image.

An imaging apparatus including solid-state imaging devices to which the present technique is applied does not necessarily have the above described structure, and may have some other structure.

Any structure described as one device (or one processor) may be designed to form two or more devices (or processors). Conversely, any structure described as two or more devices (or processors) may be combined to form one device (or one processor). Also, it is of course possible to add a structure other than the above described ones to the structures of each of the devices (or processors). Further, as long as the structure and function of the entire system remain the same, part of the structure of a device (or a processor) may be incorporated into another device (or another processor). That is, embodiments of the present technique are not limited to the above described embodiments, and various modifications may be made to them without departing from the scope of the technique.

The present technique may also be embodied in the structures described below.

(1)

An imaging device including:

a first unit pixel that includes:

a photodiode unit that receives light; and a first color filter that faces at least part of the photodiode unit, and a second color filter that faces the first color filter, the first color filter and the second color filter being located at a distance from each other.

(2)

The imaging device of (1), wherein the first color filter and the second color filter have the same spectral transmittance characteristics.

(3)

The imaging device of (1) or (2), further including a second unit pixel that includes a photodiode unit that receives light.

(4)

The imaging device of (1), (2), or (3), wherein the second unit pixel further includes a third color filter that faces at least part of the photodiode unit.

(5)

The imaging device of any of (1) through (4), wherein the first color filter and the second color filter have different spectral transmittance characteristics from each other, and the degree of similarity in spectral transmittance characteristics between the first color filter and the second color filter is higher than the degree of similarity in spectral transmittance characteristics between the first color filter and the third color filter included in the second unit pixel, and is higher than the degree of similarity in spectral transmittance characteristics between the second color filter and the third color filter included in the second unit pixel.

(6)
The imaging device of any of (1) through (5), wherein the second unit pixel further includes
a fourth color filter located at a distance from the third color filter.

(7)
The imaging device of any of (1) through (6), wherein the first unit pixel and the second unit pixel each further include an on-chip lens that collects light.

(8)
The imaging device of any of (1) through (7), wherein
the first unit pixel includes N color filters including the first color filter and the second color filter,
the second unit pixel includes M color filters including the third color filter, and
N is an integer of 2 or greater, and M is an integer of 1 or greater, M being different from N.

(9)
The imaging device of any of (1) through (8), wherein the first color filter is placed directly on the photodiode.

(10)
The imaging device of any of (1) through (9), wherein
a planarizing film is applied onto the photodiode, and
the first color filter is placed on the planarizing film.

(11)
The imaging device of any of (1) through (10), wherein
a waveguide is formed on the photodiode, and
the first color filter is placed on the waveguide.

(12)
A method of manufacturing an imaging device formed with unit pixels, the method including
manufacturing each of the unit pixels by:
forming a first color filter directly on a photodiode, on a planarizing film applied onto the photodiode, or on a waveguide formed on the photodiode;
applying a planarizing film onto the first color filter;
forming a second color filter on the planarizing film; and
forming an on-chip lens on the second color filter.

The present technique can be applied to imaging devices or imaging apparatuses.

REFERENCE SIGNS LIST

200 Pixel unit, 211-1, 211-2 Photodiode, 212-1, 212-2 Filter portion, 213-1, 213-2 On-chip lens, 221-1 Lower green color filter, 221-2 Lower red color filter, 223-1 Upper green color filter, 223-2 Upper red color filter, 240 Interconnect layer, 712 Imaging device, 731 Filter portion, 732 Pixel portion, 733 Pixel reader

The invention claimed is:

1. An imaging device comprising a first unit pixel and a second unit pixel, the first unit pixel including:
a photodiode unit configured to receive light;
a first color filter facing at least part of the photodiode unit;
a second color filter facing the first color filter, the first color filter and the second color filter being located at a distance from each other; and
a first planarizing film interposed between the first color filter and the second color filter and having a thickness corresponding to the distance, and
the second unit pixel including a third filter formed directly on a second photodiode unit configured to receive light,
wherein the first unit pixel includes N color filters including the first color filter and the second color filter, the second unit pixel, includes M color filters including the third color filter, and N is an integer greater than 2, and M is an integer greater than 1, M being different from N.

2. The imaging device according to claim 1, wherein the first color filter and the second color filter have the same spectral transmittance characteristics.

3. The imaging device according to claim 1, wherein the third color filter is facing at least part of the second photodiode unit.

4. The imaging device according to claim 3, wherein:
the first color filter and the second color filter have different spectral transmittance characteristics from each other, and
a degree of similarity in spectral transmittance characteristics between the first color filter and the second color filter is higher than a degree of similarity in spectral transmittance characteristics between the first color filter and the third color filter, and is higher than a degree of similarity in spectral transmittance characteristics between the second color filter and the third color filter.

5. The imaging device according to claim 1, wherein the second unit pixel further includes a fourth color filter located at a non-zero distance from the third color filter.

6. The imaging device according to claim 1, wherein each of the first unit pixel and the second unit pixel includes an on-chip lens configured to collect light.

7. The imaging device according to claim 1, wherein the first color filter is placed directly on the photodiode.

8. The imaging device according to claim 1, wherein a second planarizing film is applied onto the photodiode, and the first color filter is placed on the second planarizing film.

9. The imaging device according to claim 1, wherein a waveguide is formed on the photodiode, and the first color filter is placed on the waveguide.

10. A method of manufacturing an imaging device formed with a plurality of unit pixels, the method comprising manufacturing
a first unit pixel of the unit pixels by:
forming a first color filter directly on a photodiode, on a first planarizing film applied onto the photodiode, or on a waveguide formed on the photodiode;
applying a second planarizing film onto the first color filter;
forming a second color filter on the second planarizing film; and
forming an on-chip lens on the second color filter; and
a second unit pixel of the unit pixels by forming a third color filter on a second photodiode unit,
wherein the first unit pixel includes N color filters including the first color filter and the second color filter, the second unit pixel includes M color filters including the third color filter, and N is an integer greater than 2, and M is an integer greater than 1, M being different from N.

* * * * *